United States Patent
Kataoka et al.

(10) Patent No.: US 9,779,071 B2
(45) Date of Patent: Oct. 3, 2017

(54) NON-TRANSITORY COMPUTER-READABLE RECORDING MEDIUM, ENCODING METHOD, ENCODING APPARATUS, DECODING METHOD, AND DECODING APPARATUS

(71) Applicant: FUJITSU LIMITED, Kawasaki-shi, Kanagawa (JP)

(72) Inventors: Masahiro Kataoka, Kamakura (JP); Kiichi Yamada, Numazu (JP); Haruyasu Ueda, Ichikawa (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/207,876

(22) Filed: Jul. 12, 2016

(65) Prior Publication Data
US 2017/0017629 A1 Jan. 19, 2017

(30) Foreign Application Priority Data

Jul. 13, 2015 (JP) .................. 2015-139783
May 17, 2016 (JP) .................. 2016-098753

(51) Int. Cl.
| | | |
|---|---|---|
| H03M 7/30 | (2006.01) | |
| G06F 17/22 | (2006.01) | |
| G11B 20/14 | (2006.01) | |
| G06F 17/28 | (2006.01) | |
| H03M 7/40 | (2006.01) | |

(52) U.S. Cl.
CPC ...... *G06F 17/2258* (2013.01); *G06F 17/2252* (2013.01); *H03M 7/3088* (2013.01); *G06F 17/289* (2013.01); *G06F 17/2872* (2013.01); *G11B 20/1426* (2013.01); *H03M 7/30* (2013.01); *H03M 7/40* (2013.01)

(58) Field of Classification Search
CPC ....... H03M 7/30; H03M 7/40; G11B 20/1426; G06F 17/289; G06F 17/2872
USPC .... 341/87, 65, 95, 106; 704/7, 2, 3, 4, 5, 10
See application file for complete search history.

(56) References Cited

U.S. PATENT DOCUMENTS 6,502,064 B1 * 12/2002 Miyahira ............ G06F 17/2735
341/106

FOREIGN PATENT DOCUMENTS

| JP | 7-287716 | 10/1995 |
|---|---|---|
| JP | 11-85459 | 3/1999 |
| JP | 11-143877 | 5/1999 |

OTHER PUBLICATIONS

Extended European Search Report dated Jan. 27, 2017 in patent application No. 16179064.7.
(Continued)

*Primary Examiner* — Joseph Lauture
(74) *Attorney, Agent, or Firm* — Oblon, McClelland, Maier & Neustadt, L.L.P.

(57) ABSTRACT

A code converting unit encodes input text data based on an code assignment table stored in a storage device that defines a conversion rule for encoding text data, wherein; the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

15 Claims, 36 Drawing Sheets

(56) References Cited

OTHER PUBLICATIONS

"Prefix Code" archive.org, XP002765901, Jun. 14, 2015, URL: http://web.archive.org/web/20140413094940/http://en.wikipedia.org/wiki/Prefix_code, 4 pages.
Pike J, "Text Compression Using a 4 Bit Coding Scheme" The Computer Journal, vol. 24, No. 4, XP000748322, Jan. 1, 1981, pp. 324-330.

* cited by examiner

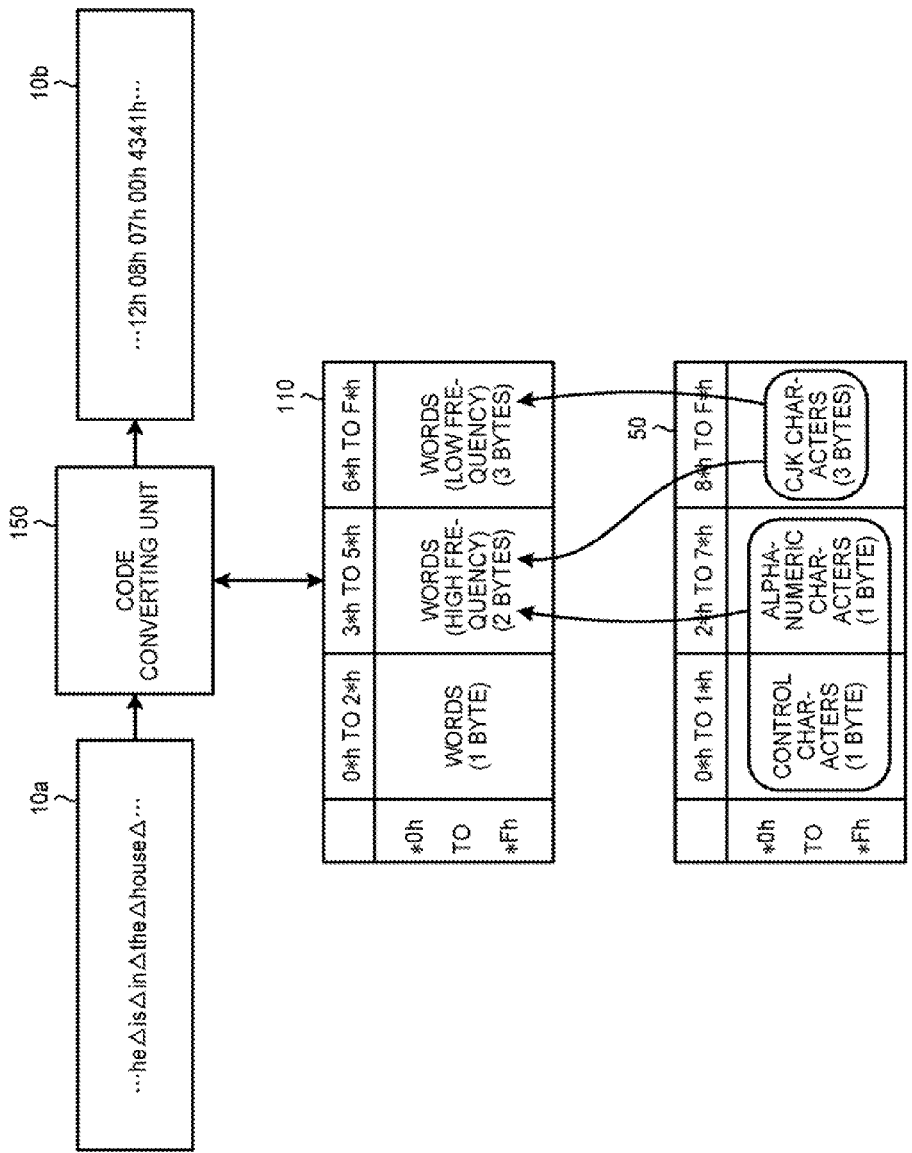

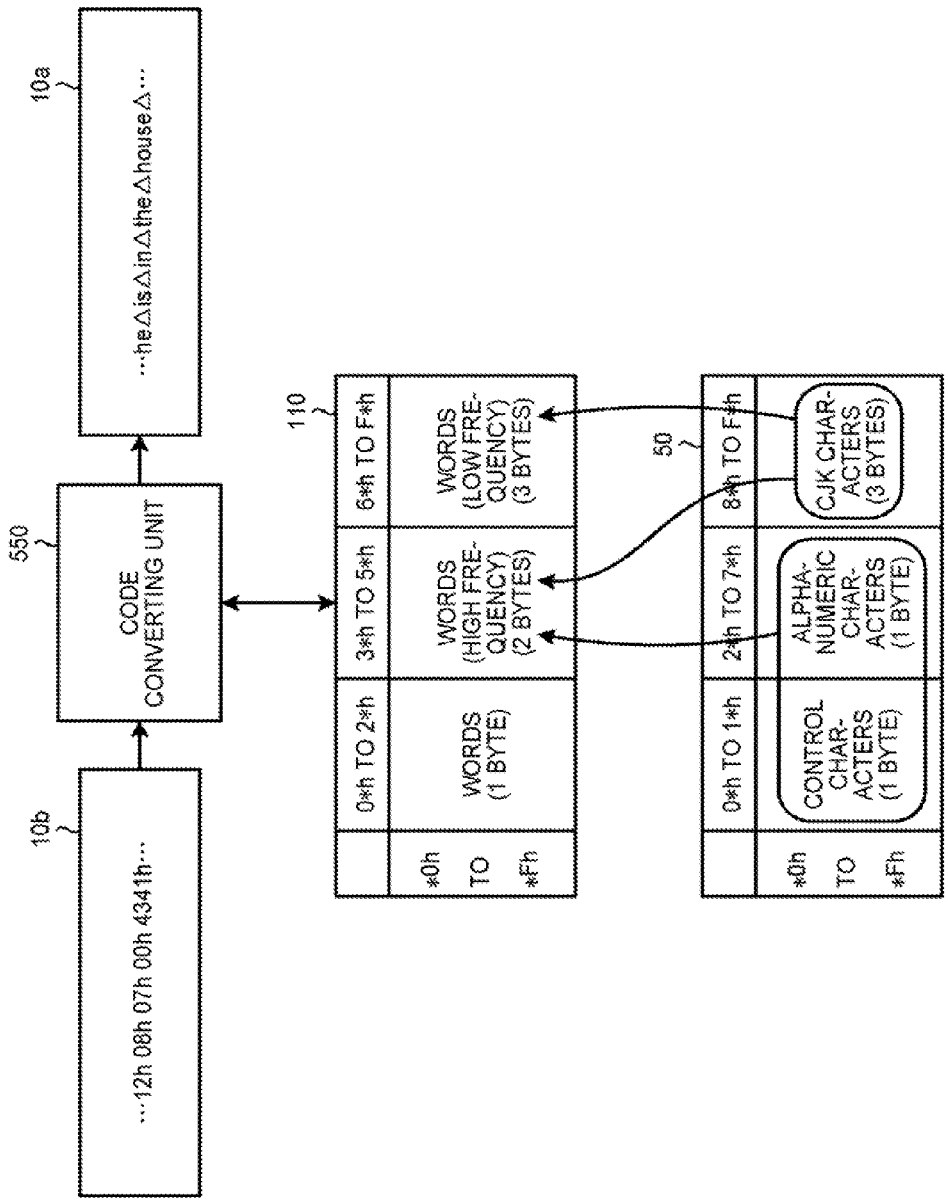

FIG.3

| | 0*h | 1*h | 2*h | 3*h | 4*h | 5*h | 6*h | 7*h | 8*h | 9*h | A*h | B*h | C*h | D*h | E*h | F*h |
|---|---|---|---|---|---|---|---|---|---|---|---|---|---|---|---|---|
| *0h | the△ | your△ | do△ | ALPHANUMERIC/ SYMBOLS | HIGH-FREQUENCY WORDS | HIGH-FREQUENCY WORDS | CJK CHAR- ACTERS | ENGLISH WORDS | JAPANESE WORDS | WORDS FROM THIRD COUNTRIES | NUMER- ICAL VALUES | TIMES | TAGS | SYNTACTIC AND SEMANTIC ANALYSES | SPARE | SPARE |
| *1h | and△ | his△ | no△ | HIRAGANA/ KATAKANA/ SYMBOLS | HIGH-FREQUENCY WORDS | HIGH-FREQUENCY WORDS | | | | | | | | | | |
| *2h | to△ | he△ | we△ | SYMBOLS | HIGH-FREQUENCY WORDS | HIGH-FREQUENCY WORDS | | | | | | | | | | |
| *3h | of△ | but△ | shall△ | | HIGH-FREQUENCY WORDS | HIGH-FREQUENCY WORDS | | | | | | | | | | |
| *4h | you△ | as△ | if△ | KANJI (CJK) | HIGH-FREQUENCY WORDS | HIGH-FREQUENCY WORDS | | | | | | | | | | |
| *5h | my△ | have△ | on△ | KANJI (CJK) | HIGH-FREQUENCY WORDS | HIGH-FREQUENCY WORDS | | | | | | | | | | |
| *6h | that△ | thou△ | or△ | KANJI (CJK) | HIGH-FREQUENCY WORDS | HIGH-FREQUENCY WORDS | | | | | | | | | | |
| *7h | in△ | so△ | thee△ | SPARE (NUMERICAL VALUES) | HIGH-FREQUENCY WORDS | HIGH-FREQUENCY WORDS | | | | | | | | | | |
| *8h | is△ | him△ | lord△ | SPARE (TIMES) | HIGH-FREQUENCY WORDS | HIGH-FREQUENCY WORDS | | | | | | | | | | |
| *9h | not△ | will△ | our△ | SPARE (TAGS) | HIGH-FREQUENCY WORDS | HIGH-FREQUENCY WORDS | | | | | | | | | | |
| *Ah | for△ | what△ | king△ | SPARE (SYNTAX) | HIGH-FREQUENCY WORDS | HIGH-FREQUENCY WORDS | | | | | | | | | | |
| *Bh | with△ | by△ | good△ | | HIGH-FREQUENCY WORDS | HIGH-FREQUENCY WORDS | | | | | | | | | | |
| *Ch | me△ | thy△ | now△ | | HIGH-FREQUENCY WORDS | HIGH-FREQUENCY WORDS | | | | | | | | | | |
| *Dh | it△ | all△ | sir△ | | HIGH-FREQUENCY WORDS | HIGH-FREQUENCY WORDS | | | | | | | | | | |
| *Eh | be△ | are△ | from△ | | HIGH-FREQUENCY WORDS | HIGH-FREQUENCY WORDS | | | | | | | | | | |
| *Fh | this△ | her△ | at△ | | HIGH-FREQUENCY WORDS | HIGH-FREQUENCY WORDS | | | | | | | | | | |

FIG.4

| | 3*h | 4*h | 5*h |
|---|---|---|---|
| *000h<br>*001h<br>TO<br>*00Fh<br>*010h<br>TO<br>*01Fh<br>*020h<br>TO<br>*02Fh<br>TO<br>*0FFh<br>*100h<br>TO<br>*1FFh<br>TO<br>*FFFh | NULL<br>SOH<br><br>SI<br>DEL<br><br>US<br>SPACE<br><br>/ | HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS | HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS<br>HIGH-FREQUENCY WORDS |

| | 6*h | 7*h | 8*h | 9*h | A*h | B*h | C*h | D*h | E*h | F*h |
|---|---|---|---|---|---|---|---|---|---|---|
| *0000h *0001h | CJK CHAR- ACTERS | ENGLISH WORDS | JAPANESE WORDS | WORDS FROM THIRD COUNTRIES | NUMERICAL VALUES | TIMES | TAGS | SYNTACTIC AND SEMANTIC ANALYSES | SPARE | SPARE |
| TO *0000Fh | | | | | | | | | | |
| *00010h TO *0001Fh | | | | | | | | | | |
| *00020h TO *0002Fh | | | | | | | | | | |
| *000FFh *00100h TO *001FFh | | | | | | | | | | |
| *00FFFh *01000h TO *FFFFFh | | | | | | | | | | |

115b

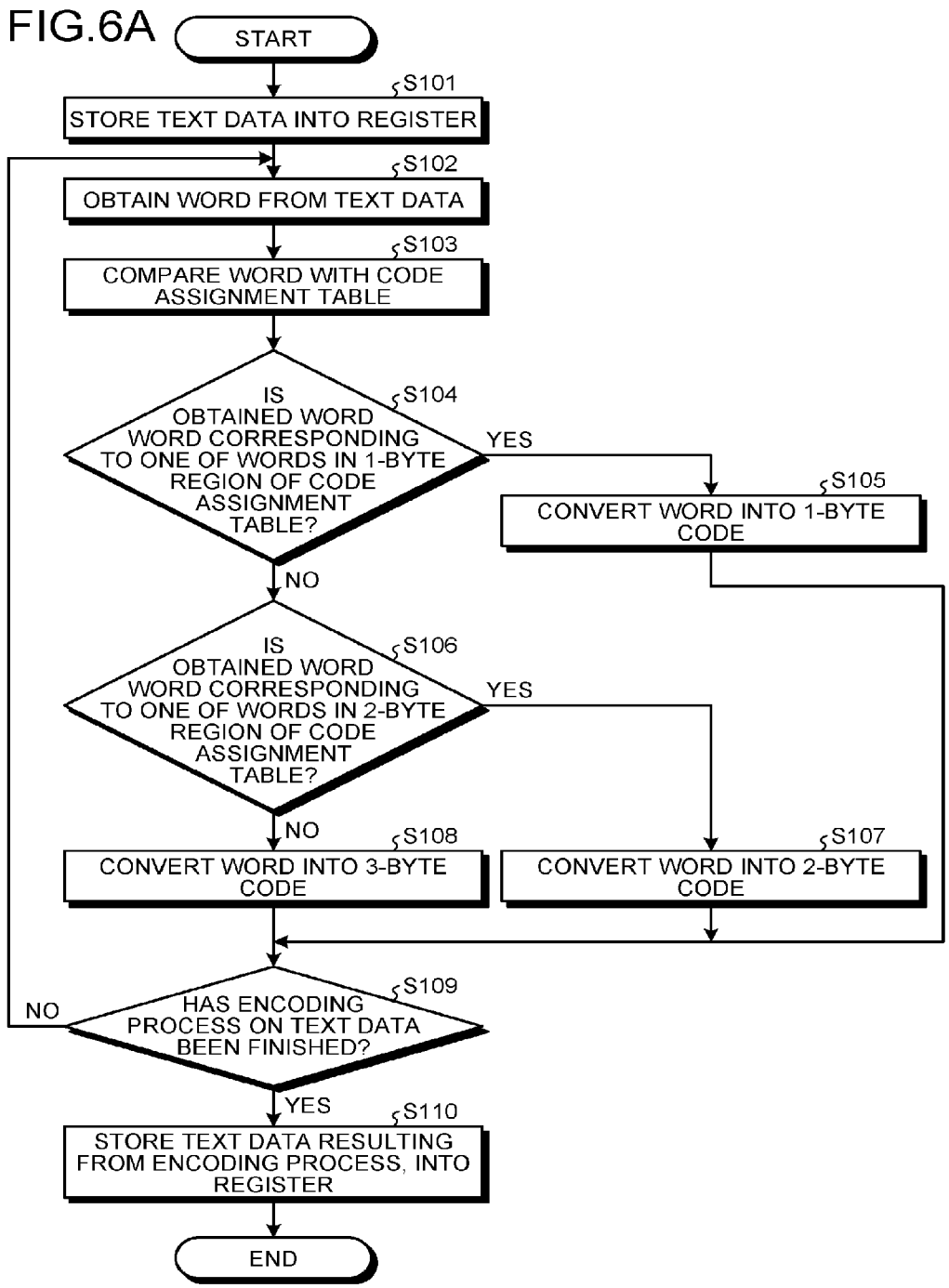

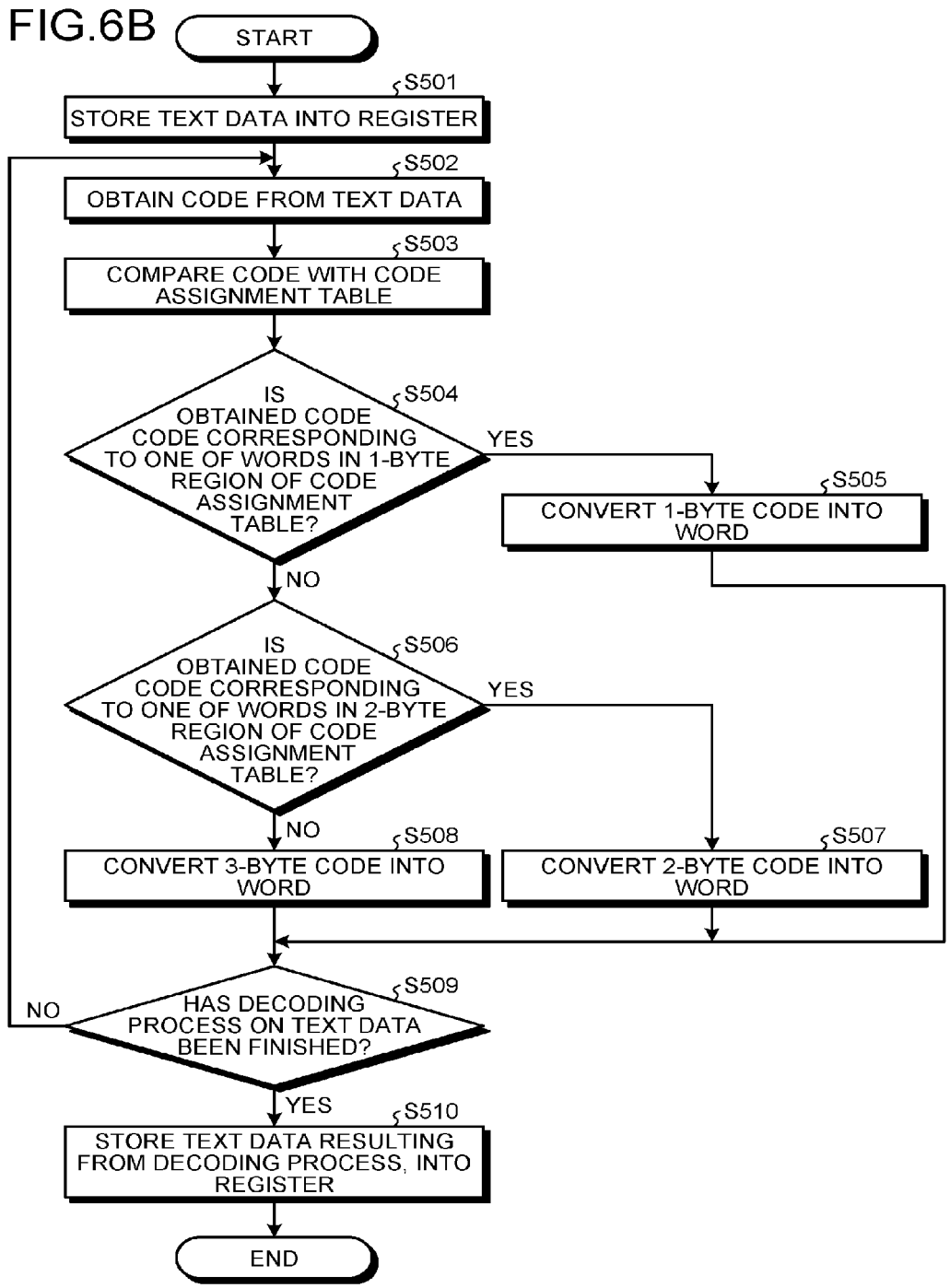

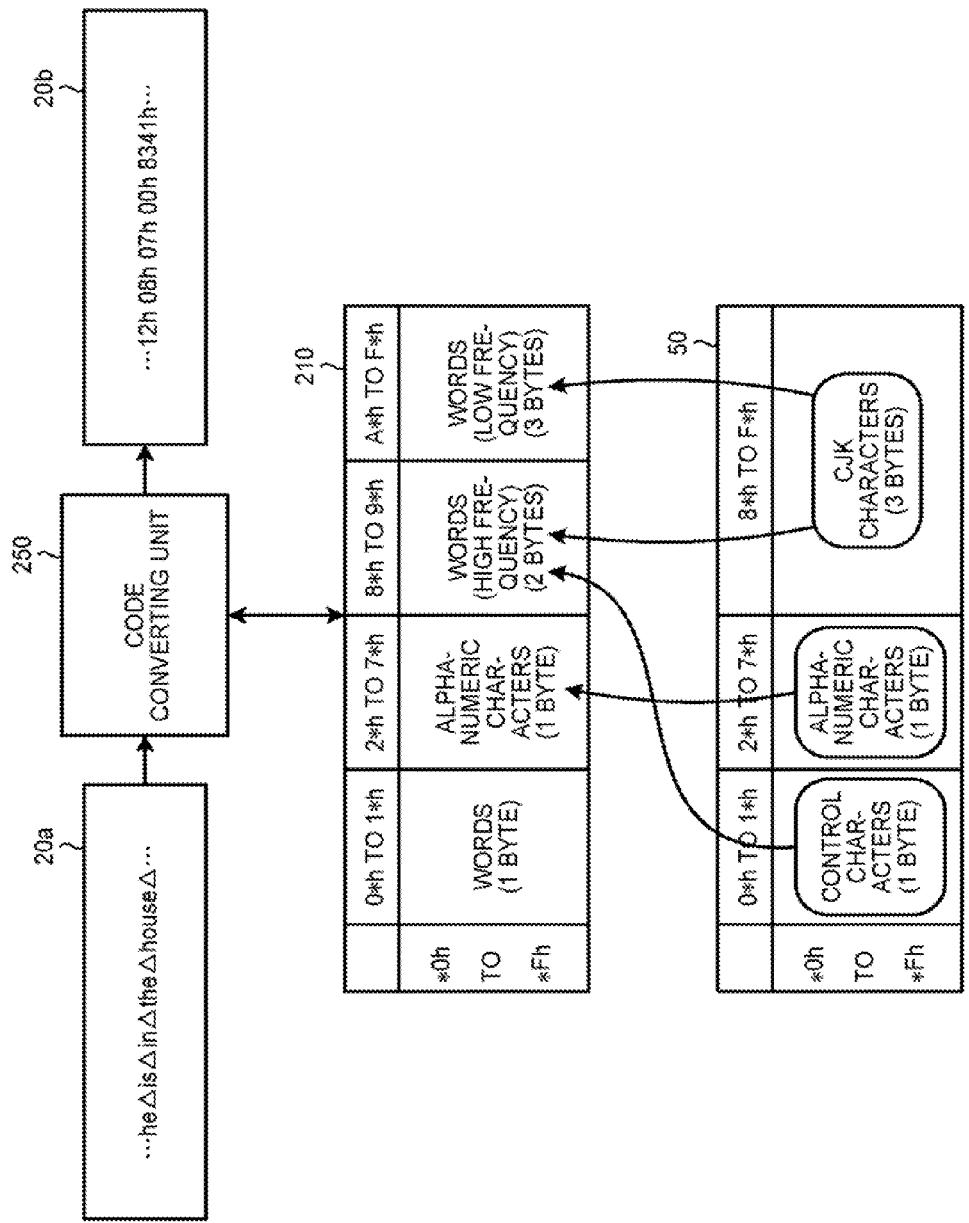

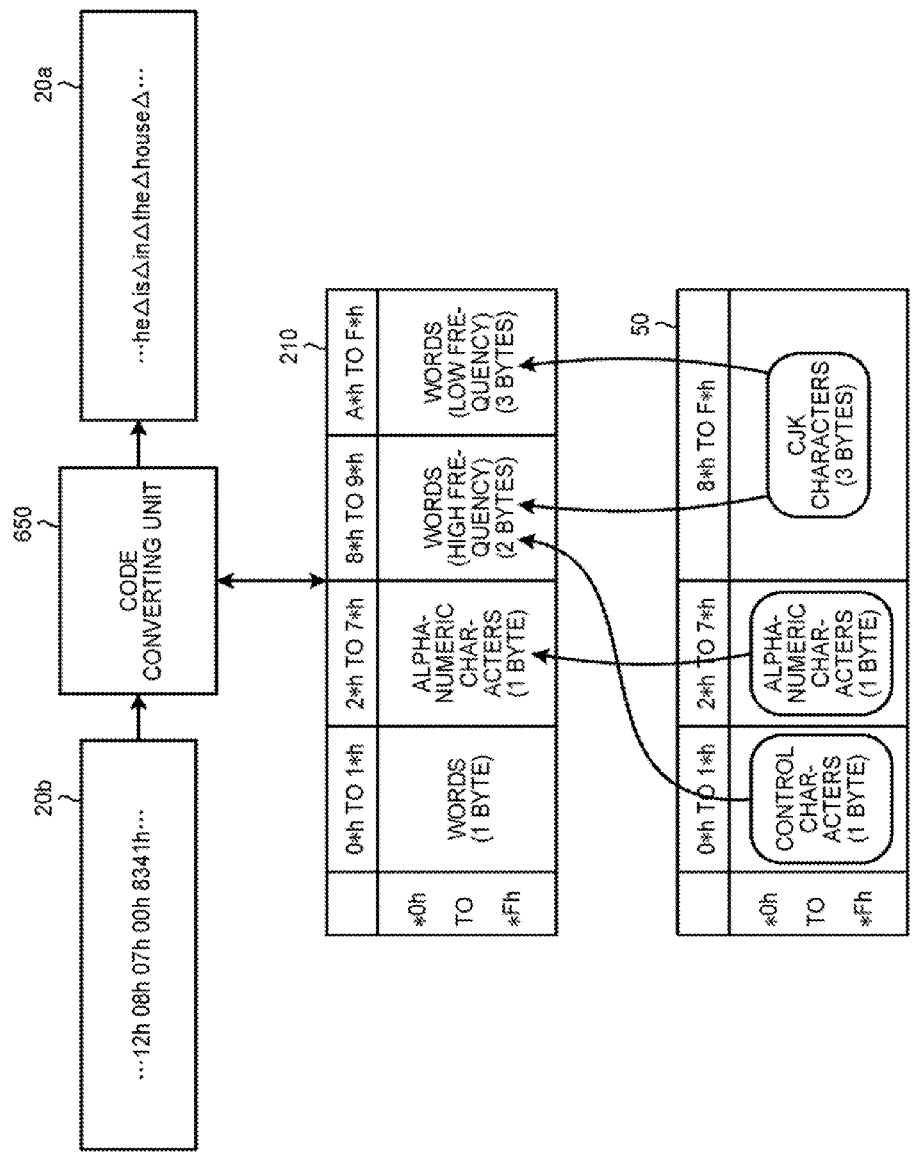

FIG.9

| | 0*h | 1*h | 2*h | 3*h | 4*h | 5*h | 6*h | 7*h | 8*h | 9*h | A*h | B*h | C*h | D*h | E*h | F*h |
|---|---|---|---|---|---|---|---|---|---|---|---|---|---|---|---|---|
| *0h | the△ | your△ | SP | 0 | @ | P | ` | p | HIGH-FREQUENCY WORDS | HIGH-FREQUENCY WORDS | CJK CHARACTERS | ENGLISH GENERAL WORDS / ENGLISH WORDS | JAPANESE WORDS | NUMERICAL VALUES / INTEGERS / DATES | TAGS | DYNAMIC CODES (UNKNOWN WORDS) |
| *1h | and△ | his△ | ! | 1 | A | Q | a | q | | | | | | | | |
| *2h | to△ | he△ | " | 2 | B | R | b | r | | | | | | | | |
| *3h | of△ | but△ | # | 3 | C | S | c | s | | | | | | | | |
| *4h | you△ | as△ | $ | 4 | D | T | d | t | | | | | | | | |
| *5h | my△ | have△ | % | 5 | E | U | e | u | | | | | | | | |
| *6h | in△ | thou△ | & | 6 | F | V | f | v | | | | | | | | |
| *7h | is△ | so△ | ' | 7 | G | W | g | w | | | | | | | | |
| *8h | not△ | him△ | ( | 8 | H | X | h | x | | | | | | | | |
| *9h | for△ | will△ | ) | 9 | I | Y | i | y | | | | | | | | |
| *Ah | with△ | what△ | * | : | J | Z | j | z | | | | | | | | |
| *Bh | me△ | by△ | + | ; | K | [ | k | { | | | | | | | | |
| *Ch | it△ | thy△ | , | < | L | \ | l | | | | | | | | | | |
| *Dh | be△ | all△ | - | = | M | ] | m | } | | | | | | | | |
| *Eh | are△ | her△ | . | > | N | ^ | n | ~ | | | | | | | | |
| *Fh | this△ | | / | ? | O | _ | o | DEL | | | | | | | | |

|  | 8*h | 9*h |
|---|---|---|
| *000h<br>*001h<br>*002h<br><br><br>*FFFh | HIGH-<br>FREQUENCY<br>WORDS | HIGH-<br>FREQUENCY<br>WORDS |

| | A*h | B*h | C*h | D*h | E*h | F*h |
|---|---|---|---|---|---|---|
| *00000h<br>*00001h<br>*00002h | CJK CHAR-<br>ACTERS | ENGLISH<br>WORDS | JAPANESE<br>WORDS | NUMERICAL<br>VALUES | TAGS | DYNAMIC<br>CODES |
| *FFFFFh | | | | | | |

215b

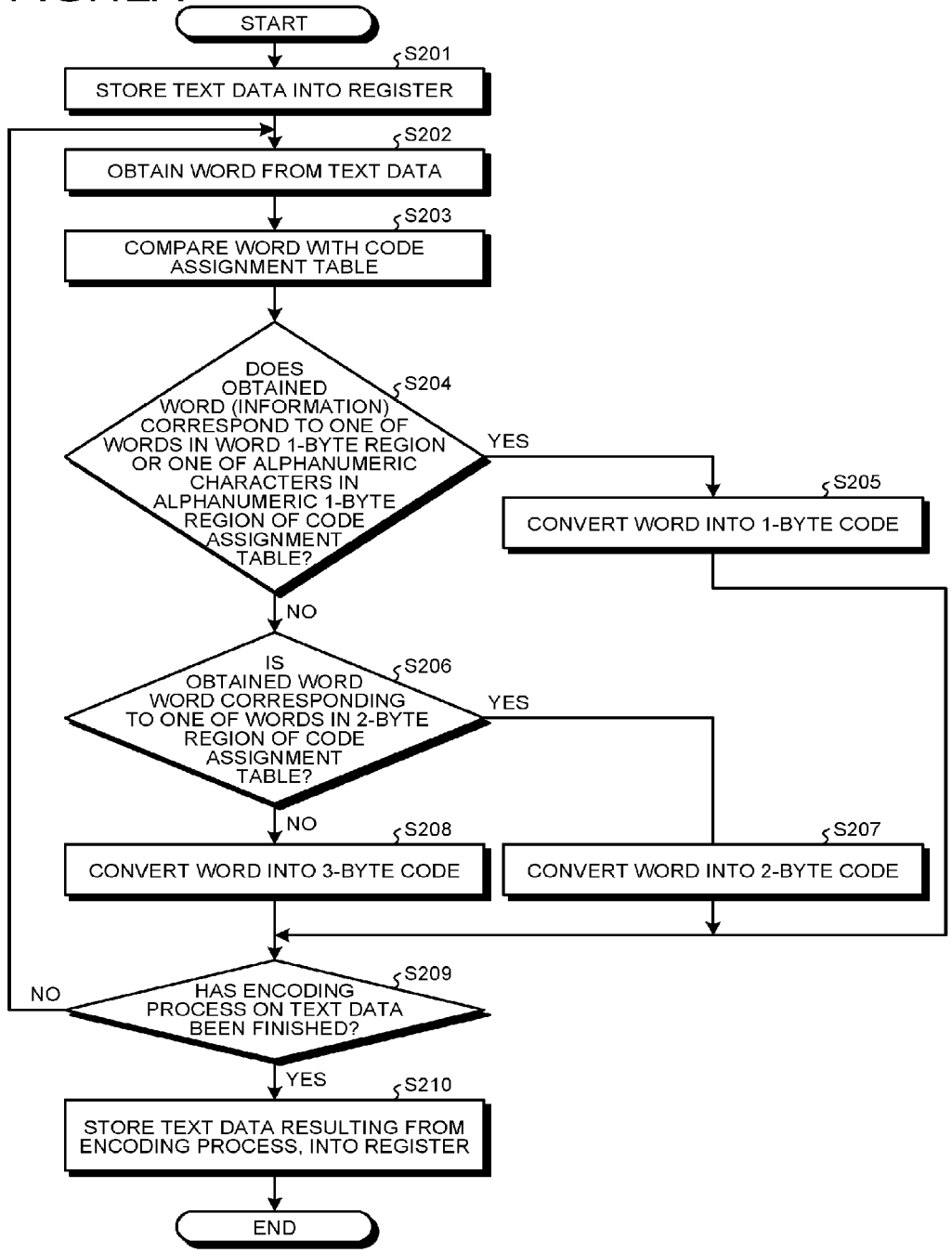

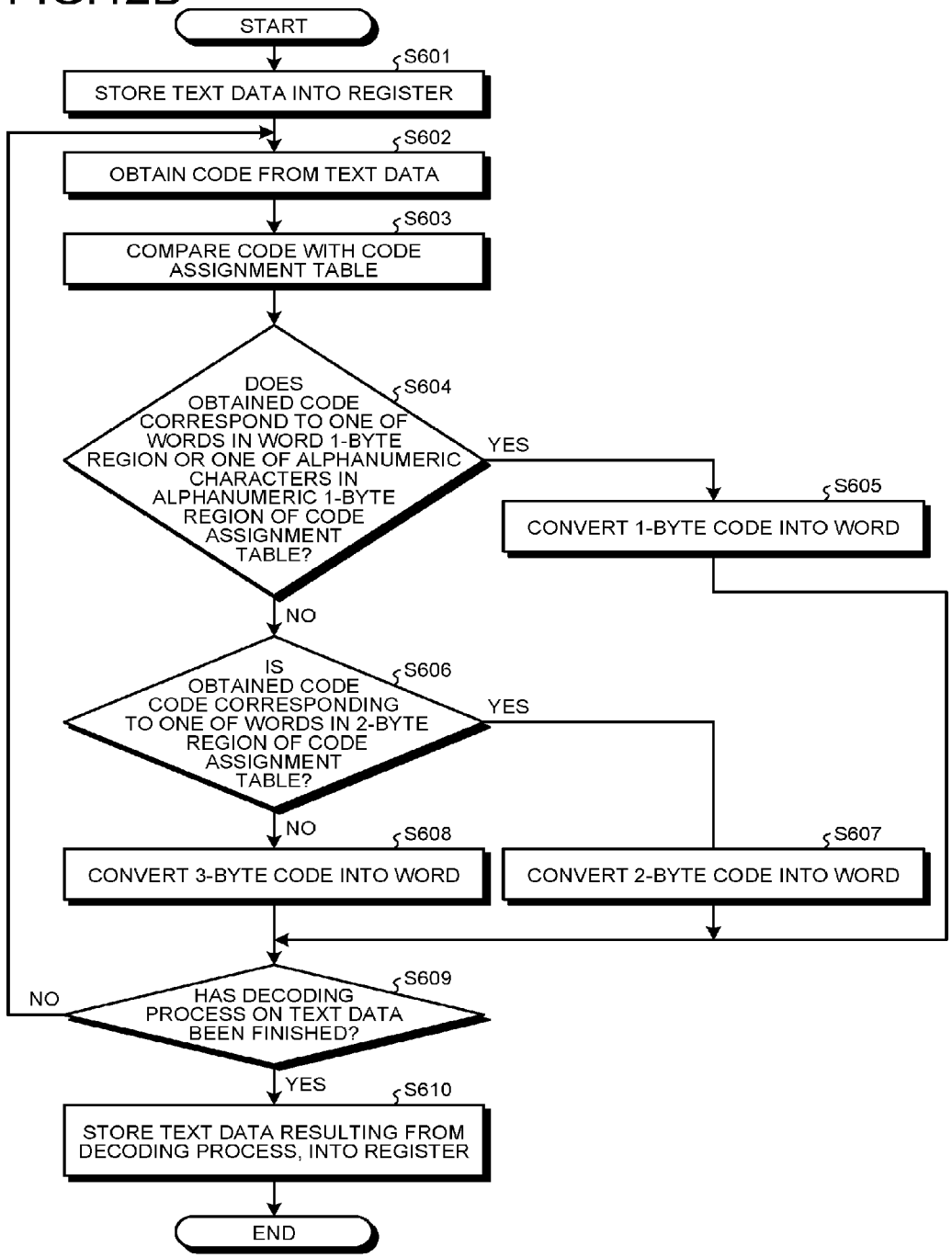

FIG.15

| | *0h | *1h | *2h | *3h | *4h | *5h | *6h | *7h | *8h | *9h | *Ah | *Bh | *Ch | *Dh | *Eh | *Fh |
|---|---|---|---|---|---|---|---|---|---|---|---|---|---|---|---|---|
| 0*h | NUL | DLE | SP(△) | not | HIGH-FRE-QUENCY WORDS (ENGLISH WORDS) | HIGH-FRE-QUENCY WORDS (ENGLISH WORDS) | 、 | を | HIGH-FRE-QUENCY WORDS (JAPANESE WORDS) | HIGH-FRE-QUENCY WORDS (JAPANESE WORDS) | LOW-FRE-QUENCY WORDS (DYNAMIC COMMON) 2 BYTES | LOW-FRE-QUENCY WORDS (DYNAMIC COMMON) | LOW-FRE-QUENCY WORDS (DYNAMIC COMMON) | LOW-FRE-QUENCY WORDS (DYNAMIC COMMON) | LOW-FRE-QUENCY WORDS (DYNAMIC COMMON) 2 BYTES | LOW-FRE-QUENCY WORDS (DYNAMIC INDIVIDUAL) 2 BYTES |
| *1h | SOH | DC1 | BS(-△) | for | | | 。 | な | | | | | | | | |
| *2h | STX | DC2 | 、 | with | | | 「 | い | | | | | | | | |
| *3h | ETX | DC3 | 。 | me | | | 」 | て | | | | | | | | |
| *4h | EOT | DC4 | CAPITALS (INITIAL) | it | | | ・ | の | | | | | | | | |
| *5h | ENQ | NAK | CAPITALS (ALL) | be | | | ぁ | か | | | | | | | | |
| *6h | ACK | SYN | the | this | | | あ | が | | | | | | | | |
| *7h | BEL | ETB | and | your | | | ぃ | き | | | | | | | | |
| *8h | BS | CAN | to | his | | | い | ぎ | | | | | | | | |
| *9h | HT | EM | of | he | | | ぅ | く | | | | | | | | |
| *Ah | LF/NL | SUB/EOF | you | but | | | う | ぐ | | | | | | | | |
| *Bh | VT | ESC | my | as | | | ぇ | け | | | | | | | | |
| *Ch | FF/NP | FS | that | have | | | え | げ | | | | | | | | |
| *Dh | CR | GS | in | so | | | ぉ | こ | | | | | | | | |
| *Eh | SO | RS | is | him | | | お | ご | | | | | | | 3 BYTES | 3 BYTES |
| *Fh | SI | US | | will | | | か | DEL | | | | | | | | |

|  | 4*h | 5*h |
|---|---|---|
| *000h<br>*001h<br>*002h<br><br><br>*FFFh | HIGH-<br>FREQUENCY<br>ENGLISH<br>WORDS | HIGH-<br>FREQUENCY<br>ENGLISH<br>WORDS |

|  | 8*h | 9*h |
|---|---|---|
| *000h<br>*001h<br>*002h<br><br><br>*FFFh | HIGH-<br>FREQUENCY<br>JAPANESE<br>WORDS | HIGH-<br>FREQUENCY<br>JAPANESE<br>WORDS |

FIG.18

| | A*h | B*h | C*h | D*h | E*h | F*h |
|---|---|---|---|---|---|---|
| *000h *001h *002h ... *FFFh | LOW-FRE-QUENCY WORDS | LOW-FRE-QUENCY WORDS | LOW-FRE-QUENCY WORDS | LOW-FRE-QUENCY WORDS | LOW-FRE-QUENCY WORDS | LOW-FRE-QUENCY WORDS |

| | E*h | F*h |
|---|---|---|
| *90000h *90001h *90002h ... *FFFFFh | LOW-FRE-QUENCY WORDS | LOW-FRE-QUENCY WORDS |

316

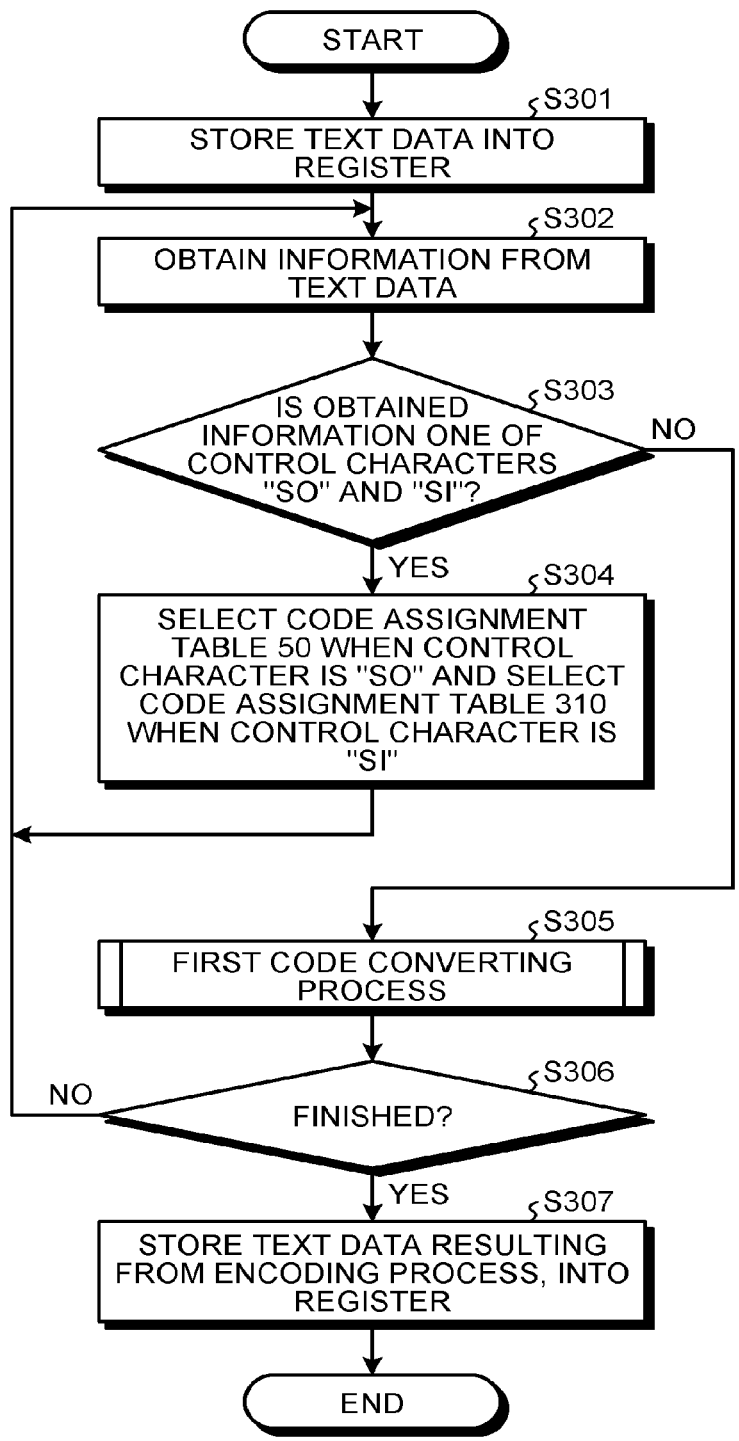

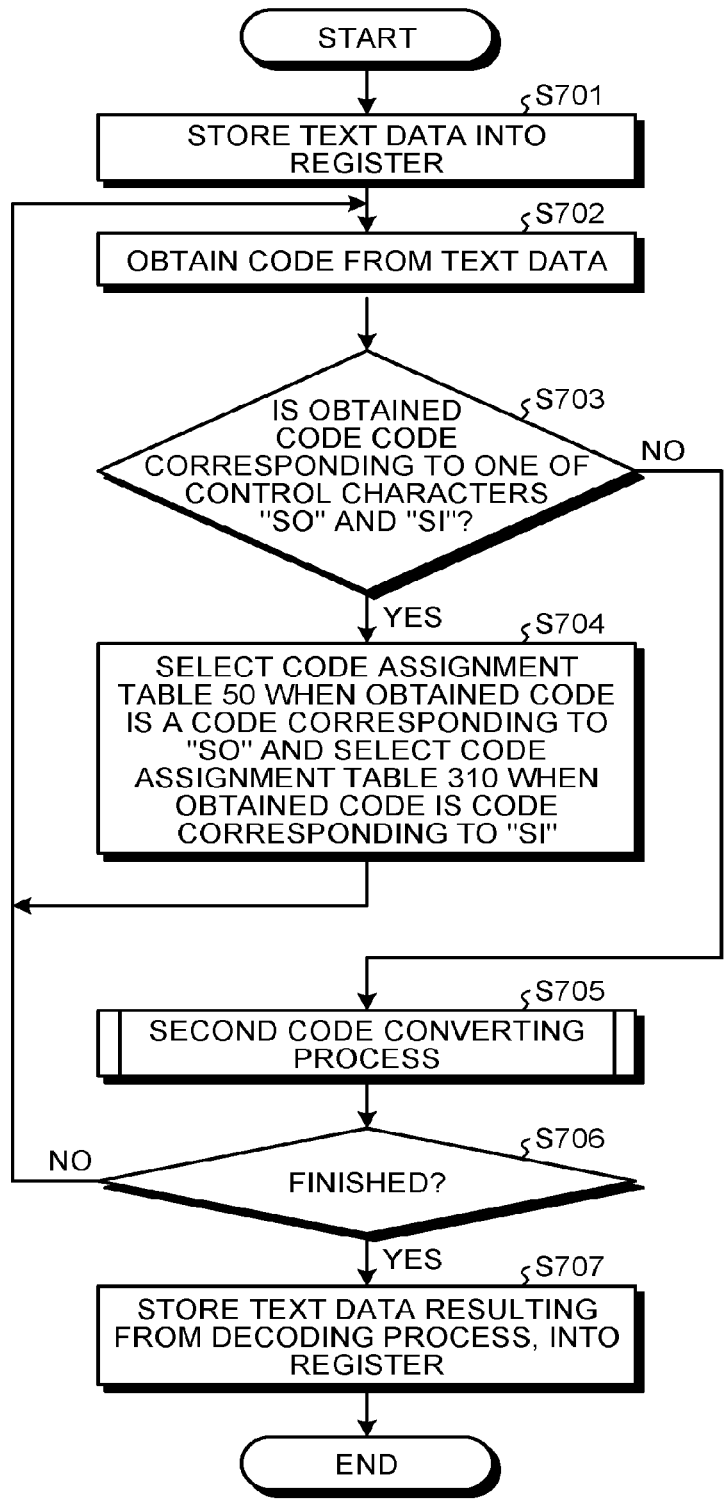

|  | 0*h | 1*h | 2*h |
|---|---|---|---|
| *0h | the△ | your△ | do△ |
| *1h | and△ | his△ | no△ |
| *2h | to△ | he△ | we△ |
| *3h | of△ | but△ | shall△ |
| *4h | you△ | as△ | if△ |
| *5h | my△ | have△ | on△ |
| *6h | that△ | thou△ | or△ |
| *7h | in△ | so△ | thee△ |
| *8h | is△ | him△ | lord△ |
| *9h | not△ | will△ | our△ |
| *Ah | for△ | what△ | king△ |
| *Bh | with△ | by△ | good△ |
| *Ch | me△ | thy△ | now△ |
| *Dh | it△ | all△ | sir△ |
| *Eh | be△ | are△ | from△ |
| *Fh | this△ | her△ | at△ |

FIG.23

|  | 3*h | 4*h | 5*h |
|---|---|---|---|
| *000h | NULL | HIGH-FREQUENCY WORD | HIGH-FREQUENCY WORD |
| *001h | SOH | HIGH-FREQUENCY WORD | HIGH-FREQUENCY WORD |
| TO |  | HIGH-FREQUENCY WORD | HIGH-FREQUENCY WORD |
| *00Fh | SI | HIGH-FREQUENCY WORD | HIGH-FREQUENCY WORD |
| *010h | DEL | HIGH-FREQUENCY WORD | HIGH-FREQUENCY WORD |
| TO |  | HIGH-FREQUENCY WORD | HIGH-FREQUENCY WORD |
| *01Fh | US | HIGH-FREQUENCY WORD | HIGH-FREQUENCY WORD |
| *020h | SPACE | HIGH-FREQUENCY WORD | HIGH-FREQUENCY WORD |
| TO |  | HIGH-FREQUENCY WORD | HIGH-FREQUENCY WORD |
| *02Fh | / | HIGH-FREQUENCY WORD | HIGH-FREQUENCY WORD |
| TO |  | HIGH-FREQUENCY WORD | HIGH-FREQUENCY WORD |
| *0FFh |  | HIGH-FREQUENCY WORD | HIGH-FREQUENCY WORD |
| *100h |  | HIGH-FREQUENCY WORD | HIGH-FREQUENCY WORD |
| TO |  | HIGH-FREQUENCY WORD | HIGH-FREQUENCY WORD |
| *1FFh |  | HIGH-FREQUENCY WORD | HIGH-FREQUENCY WORD |
| TO |  | HIGH-FREQUENCY WORD | HIGH-FREQUENCY WORD |
| *FFFh |  | HIGH-FREQUENCY WORD | HIGH-FREQUENCY WORD |

| | 6*h | 7*h | 8*h | 9*h | A*h | B*h | C*h | D*h | E*h | F*h 806c |
|---|---|---|---|---|---|---|---|---|---|---|
| | CJK CHARA-CTERS | ENGLISH WORDS | JAPANESE WORDS | WORDS FROM THIRD COUNTRIES | NUMERICAL VALUES | TIMES | TAGS | SYNTACTIC AND SEMANTIC ANALYSES | SPARE | SPARE |
| *00000h *00001h TO *0000Fh | | | | | | | | | | |
| *00010h TO *0001Fh | | | | | | | | | | |
| *00020h TO *0002Fh | | | | | | | | | | |
| *000FFh *00100h TO *001FFh | | | | | | | | | | |
| *00FFh *01000h TO *FFFFFh | | | | | | | | | | |

|  | 0*h TO 1*h | 2*h TO 7*h | 8*h TO F*h |
|---|---|---|---|
| *0h TO *Fh | CONTROL CHAR-ACTERS (1 BYTE) | ALPHA-NUMERIC CHAR-ACTERS (1 BYTE) | CJK CHAR-ACTERS (3 BYTES) |

NON-TRANSITORY COMPUTER-READABLE RECORDING MEDIUM, ENCODING METHOD, ENCODING APPARATUS, DECODING METHOD, AND DECODING APPARATUS

CROSS-REFERENCE TO RELATED APPLICATION(S)

This application is based upon and claims the benefit of priority of the prior Japanese Patent Application No. 2015-139783, filed on Jul. 13, 2015 and Japanese Patent Application No. 2016-098753, filed on May 17, 2016, the entire contents of which are incorporated herein by reference.

FIELD

The embodiments discussed herein are related to an encoding computer program (hereinafter, "encoding program") and the like.

BACKGROUND

Conventional text data can be replaced with predetermined codes on the basis of a code assignment table of the ASCII code and Unicode. FIG. 30 is a drawing for explaining a conventional code assignment table based on the ASCII code and Unicode. As illustrated in FIG. 30, predetermined control characters are set in 00h to 1Fh in the code assignment table, and a one-byte code (hereinafter, "1-byte code") is assigned to each of the control characters. Alphanumeric characters are set in 20h to 7Fh in the code assignment table, and a 1-byte code is assigned to each of the alphanumeric characters. Further, CJK characters are set in 80h to FFh in the code assignment table, and a three-byte code (hereinafter, "3-byte code") is assigned to each of the CJK characters.

In this regard, in Japanese Laid-open Patent Publication No. 07-287716 (hereinafter, "conventional example 1"), a technique is described by which, when there is a free region in the range from 00h to 1Fh to which control characters are assigned in a code assignment table, words and the like are registered into the free region, so that an encoding process is performed by using the code assignment table arranged in that manner. Further, in Japanese Laid-open Patent Publication No. 11-143877 (hereinafter, "conventional example 2"), another technique is described by which, in a region for the English capital letters in a code assignment table, other characters are set in place of the English capital letters, so that an encoding process is performed by using the code assignment table arranged in this manner.

Patent Document 1: Japanese Laid-open Patent Publication No. 07-287716
Patent Document 2: Japanese Laid-open Patent Publication No. 11-143877

However, the conventional examples described above have a problem where it is not possible to assign short bytecodes to words of which the frequency of appearance is high and general symbols.

For example, only when people who transmit and receive text data to each other share the unused control characters or the English capital letters and the code assignment table therefor, it is possible to assign short bytecodes to the characters and words of which the frequency of appearance is high, by assigning the words to the free region for the control characters or the like, as described in conventional examples 1 and 2 above.

In contrast, when variable-length codes are assigned to words and general symbols included in general text data, depending on the frequency of appearance thereof, the code length of approximately 40 types of words and general symbols is in the range of five to eight bits, whereas the code length of approximately 8,000 types of words and general symbols is in the range of nine to sixteen bits. Thus, by assigning a 1-byte code to each of 32 or more types of words and general symbols and assigning a 2-byte code to each of 8,192 or more types of words and general symbols, depending on the frequency of appearance thereof, it is possible to implement a compressing process that can achieve a high compression ratio. However, according to conventional examples 1 and 2, it is not possible to assign codes to a large number of words and general symbols.

SUMMARY

According to an aspect of an embodiment, a non-transitory computer-readable recording medium stores therein an encoding program that causes a computer to execute a process including: encoding input text data based on an code assignment table stored in a storage device that defines a conversion rule for encoding text data, wherein; the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1A is a drawing of an example of a process performed by an encoding apparatus according to a first embodiment;

FIG. 1B is a drawing of an example of a process performed by a decoding apparatus according to the first embodiment;

FIG. 3 is a drawing of an example of a code assignment table according to the first embodiment;

FIG. 4 is a drawing of an example of a 2-byte code assignment table according to the first embodiment;

FIG. 5 is a drawing of an example of a 3-byte code assignment table according to the first embodiment;

FIG. 6A is a flowchart illustrating a processing procedure performed by the encoding apparatus according to the first embodiment;

FIG. 6B is a flowchart illustrating a processing procedure performed by the decoding apparatus according to the first embodiment;

FIG. 7A is a drawing of an example of a process performed by an encoding apparatus according to a second embodiment;

FIG. 7B is a drawing of an example of a process performed by a decoding apparatus according to the second embodiment;

FIG. 9 is a drawing of an example of a code assignment table according to the second embodiment;

FIG. 10 is a drawing of an example of a 2-byte code assignment table according to the second embodiment;

FIG. 11 is a drawing of an example of a 3-byte code assignment table according to the second embodiment;

FIG. 12A is a flowchart illustrating a processing procedure performed by the encoding apparatus according to the second embodiment;

FIG. 12B is a flowchart illustrating a processing procedure performed by the decoding apparatus according to the second embodiment;

FIG. 15 is a drawing of an example of a code assignment table according to the third embodiment;

FIG. 16 is a drawing of an example of an English word 2-byte code assignment table according to the third embodiment;

FIG. 17 is a drawing of an example of a Japanese word 2-byte assignment table according to the third embodiment;

FIG. 18 is a drawing of an example of a 2-/3-byte assignment table according to the third embodiment;

FIG. 19A is a flowchart illustrating a processing procedure performed by the encoding apparatus according to the third embodiment;

FIG. 19B is a flowchart illustrating a processing procedure performed by the decoding apparatus according to the third embodiment;

FIG. 22 is a table illustrating an example of a first automaton;

FIG. 23 is a table illustrating an example of a second automaton;

FIG. 24 is a table illustrating an example of a third automaton;

DESCRIPTION OF EMBODIMENTS

Figure 2A:
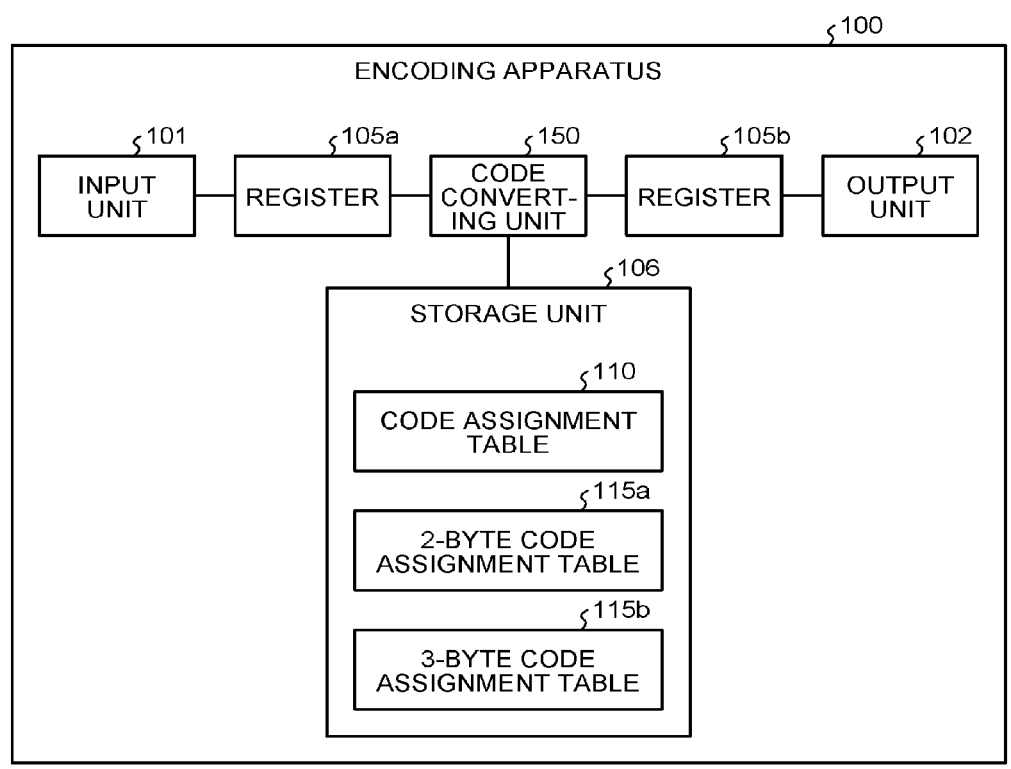
FIG. 2A is a functional block diagram illustrating a configuration of the encoding apparatus according to the first embodiment.

Preferred embodiments of the present invention will be explained with reference to accompanying drawings. The present invention is not limited to the exemplary embodiments.

[a] First Embodiment

FIG. 1A is a drawing of an example of a process performed by an encoding apparatus according to a first embodiment. The encoding apparatus according to the first embodiment generates code-converted text data 10$b$, by performing a code conversion on text data 10$b$ while using a code assignment table 110, in place of a code assignment table 50 used in a conventional example.

Control characters are set in 00h to 1Fh in the code assignment table 50 of the conventional example, and a 1-byte code is assigned to each of the control characters. The letter "h" is a symbol that denotes a hexadecimal number. Alphanumeric characters are set in 20h to 7Fh in the code assignment table 50, and a 1-byte code is assigned to each of the alphanumeric characters. CJK characters are set in 80h to FFh in the code assignment table 50, and a 3-byte code is assigned to each of the CJK characters.

In contrast, predetermined words explained later are set in 00h to 2Fh in the code assignment table 110 according to the first embodiment, and a 1-byte code is assigned thereto. The region corresponding to 00h to 2Fh in the code assignment table 110 includes the region to which the control characters are assigned in the code assignment table 50.

High-frequency words and the like are set in 30h to 5Fh in the code assignment table 110. Further, the control characters set in 00h to 1Fh in the code assignment table 50 and the alphanumeric characters set in 20h to 7Fh in the code assignment table 50 are set in 30h to 5Fh in the code assignment table 110. Further, a part of the CJK characters set in 80h to FFh in the code assignment table 50 are set in 30h to 5Fh in the code assignment table 110. A 2-byte code is assigned to each of the high-frequency words, the control characters, the alphanumeric characters, and the CJK characters that are set in 30h to 5Fh in the code assignment table 110.

In other words, the control characters and the alphanumeric characters that are set in 00h to 7Fh in the code assignment table 50 and that each have a 1-byte code hitherto assigned thereto are assigned to a part of the range from 30h to 5Fh in the code assignment table 110 and each have a 2-byte code assigned thereto.

Low-frequency words and the like are set in 60h to FFh in the code assignment table 110. Further, a part of the CJK characters set in 80h to FFh in the code assignment table 50 are set in 60h to FFh in the code assignment table 110.

In the first embodiment, the region corresponding to 00h to 2Fh in the code assignment table 110 will be referred to as a "1-byte region" in the explanation below, as appropriate. The region corresponding to 30h to 5Fh in the code assignment table 110 will be referred to as a "2-byte region". The region corresponding to 60h to FFh in the code assignment table 110 will be referred to as a "3-byte region".

A code converting unit 150 converts text data 10a into the text data 10b, on the basis of the code assignment table 110. In the present example, let us assume that the text data 10a reads " . . . heΔisΔinΔtheΔhouseΔ . . . ". The symbol "Δ" in the text data 10a denotes a space.

The code converting unit 150 converts each of the words into a code by comparing the words separated by the spaces "Δ" with the code assignment table 110. The word "heΔ" included in the text data 10a is one of the words set in the 1-byte region of the code assignment table 110. Thus, the code converting unit 150 converts the word "heΔ" into the 1-byte code "12h".

The word "isΔ" included in the text data 10a is one of the words set in the 1-byte region of the code assignment table 110. Thus, the code converting unit 150 converts the word "isΔ" into the 1-byte code "08h".

The word "inΔ" included in the text data 10a is one of the words set in the 1-byte region of the code assignment table 110. Thus, the code converting unit 150 converts the word "inΔ" into the 1-byte code "07h".

The word "theΔ" included in the text data 10a is one of the words set in the 1-byte region of the code assignment table 110. Thus, the code converting unit 150 converts the word "theΔ" into the 1-byte code "00h".

The word "houseΔ" included in the text data 10a is one of the words set in the 2-byte region of the code assignment table 110. Thus, the code converting unit 150 converts the word "houseΔ" into the 2-byte code "4341h", for example.

The code converting unit 150 encodes the text data 10a into the text data 10b, by performing the process described above on each of the words included in the text data 10a.

FIG. 1B is a drawing of an example of a process performed by a decoding apparatus according to the first embodiment. The decoding apparatus according to the first embodiment generates the text data 10a by performing a character code conversion on the code-converted text data 10b, while using the code assignment table 110, in place of the code assignment table 50 used in the conventional example. The explanation about the code assignment table 110 is the same as the explanation above.

A code converting unit 550 converts the text data 10b into the text data 10a on the basis of the code assignment table 110. In the present example, let us assume that the text data 10b reads " . . . 12h 08h 07h 00h 4341h . . . ".

The code converting unit 550 converts the codes into the words, by comparing the codes with the code assignment table 110. For example, the code converting unit 550 converts the 1-byte code "12h" into the word "heΔ". Further, the code converting unit 550 converts the 1-byte code "08h" into the word "isΔ". Also, the code converting unit 550 converts the 1-byte code "07h" into the word "inΔ". Furthermore, the code converting unit 550 converts the 1-byte code "00h" into the word "theΔ". In addition, the code converting unit 550 converts the 2-byte code "4341h" into the word "houseΔ".

The code converting unit 550 converts the text data 10b into the text data 10a by performing the process described above on each of the codes included in the text data 10b.

FIG. 2A is a functional block diagram illustrating a configuration of the encoding apparatus according to the first embodiment. As illustrated in FIG. 2, an encoding apparatus 100 includes an input unit 101, an output unit 102, registers 105a and 105b, a storage unit 106, and the code converting unit 150.

The input unit 101 is a processing unit that receives text data on which the code conversion is to be performed. The input unit 101 stores the received text data into the register 105a.

The output unit 102 is a processing unit that outputs the text data after the code conversion stored in the register 105b.

The register 105a is for storing therein the text data before the code conversion. The register 105b is for storing therein the text data after the code conversion.

The storage unit 106 includes the code assignment table 110, a 2-byte code assignment table 115a, and a 3-byte code assignment table 115b. For example, the storage unit 106 corresponds to a storage device configured by using a semiconductor memory element such as a Random Access Memory (RAM), a Read-Only Memory (ROM), a flash memory, or the like.

FIG. 3 is a drawing of an example of the code assignment table according to the first embodiment. The code assignment table 110 is a table in which words and the like and the predetermined codes are kept in correspondence with one another and corresponds to the code assignment table 110 explained with reference to FIG. 1A. As illustrated in FIG. 3, the code assignment table 110 includes a 1-byte region 110A, a 2-byte region 110B, and a 3-byte region 110C.

The 1-byte region 110A is a region corresponding to 00h to 2Fh in the code assignment table 110. In the 1-byte region 110A, 48 words that have the highest frequency of appearance are set, on the basis of Aozora Bunko, *The Oxford English Dictionary*, and other general books.

To each of the words set in the 1-byte region 110A, a 1-byte code corresponding to the setting position thereof in the 1-byte region 110A is assigned. The 1-byte code "00h" is assigned to the word "theΔ". Similarly, a 1-byte code is assigned to each of the other words set in the 1-byte region 110A.

The 2-byte region 110B is a region corresponding to 30h to 5Fh in the code assignment table 110. In the 2-byte region 110B, words of which the frequency of appearance is equal to or higher than a predetermined value are set, on the basis of Aozora Bunko, *The Oxford English Dictionary*, and other general books. In the explanation below, the words of which the frequency of appearance is equal to or higher than the predetermined value will be referred to as "high-frequency words", as appropriate. Further, the 2-byte region 110B also includes alphanumeric characters, symbols, the Japanese Hiragana alphabet, the Japanese Katakana alphabet, Japanese Kanji characters, numerical values, times, tags, syntax, and the like.

In this situation, defined in the 2-byte region 110B are only the 1-byte codes in the first halves of the 2-byte codes assigned to the high-frequency words and the like set in the 2-byte region 110B. The 2-byte codes assigned to the words and the like set in the 2-byte region 110B are defined in the 2-byte code assignment table 115a, which is explained later.

For example, of the 2-byte codes assigned to the alphanumeric characters, the symbols, the Japanese Hiragana alphabet, the Japanese Katakana alphabet, the Japanese Kanji characters, the numerical values, the times, the tags, and the syntax, in the 2-byte region 110B, the 1-byte codes in the first halves are "30h to 3Fh". Further, the 1-byte codes in the first halves and the remaining 1-byte codes are defined in the 2-byte code assignment table 115a.

Of the 2-byte codes assigned to the high-frequency words in the 2-byte region 110B, the 1-byte codes in the first halves are "40h to 5Fh". Further, the 1-byte codes in the first halves and the remaining 1-byte codes are defined in the 2-byte code assignment table 115a.

The 3-byte region 110C is a region corresponding to 60h to FFh in the code assignment table 110. In the 3-byte region 110C, low-frequency words of which the frequency of appearance is lower than the predetermined value are set, on the basis of Aozora Bunko, *The Oxford English Dictionary*, and other general books. For example, the 3-byte region 110C includes CJK characters, English words, Japanese words, words from third countries, numerical values, times, tags, results of syntactic and semantic analyses, and the like.

In this situation, defined in the 3-byte region 110C are only the 1-byte codes in the first halves of the 3-byte codes assigned to the words and the like set in the 3-byte region 110C. The 3-byte codes assigned to the words and the like set in the 3-byte region 110C are defined in the 3-byte code assignment table 115b, which is explained later.

For example, of the 3-byte codes assigned to the CJK characters, the English words, the Japanese words, the words from third countries, the numerical values, the times, the tags, the results of syntactic and semantic analyses, and the like in the 3-byte region 110C, the 1-byte codes in the first halves are "60h to FFh". Further, the 1-byte codes in the first halves and the remaining 2-byte codes are defined in the 3-byte code assignment table 115b.

FIG. 4 is a drawing of an example of the 2-byte code assignment table according to the first embodiment. As illustrated in FIG. 4, the 2-byte code assignment table 115a keeps the high-frequency words and the 2-byte codes in correspondence with one another. Further, the 2-byte code assignment table 115a keeps the alphanumeric characters, the symbols, the Japanese Hiragana alphabet, the Japanese Katakana alphabet, the Japanese Kanji characters, the numerical values, the times, the tags, and the syntax and the 2-byte codes in correspondence with one another.

In the 2-byte code assignment table 115a, the alphanumeric characters, the symbols, the Japanese Hiragana alphabet, the Japanese Katakana alphabet, the Japanese Kanji characters, the numerical values, the times, the tags, and the syntax are set in "3000h to 3FFFh", and 2-byte codes corresponding to the setting positions thereof are assigned thereto. For example, the 2-byte code "3000h" is assigned to "NULL".

In the 2-byte code assignment table 115a, the high-frequency words are set in "4000h to 5FFFh", and 2-byte codes corresponding to the setting positions thereof are assigned thereto. For example, the 2-byte code "4000h" is assigned to the high-frequency word set in the setting position "4000h".

FIG. 5 is a drawing of an example of the 3-byte code assignment table according to the first embodiment. As illustrated in FIG. 5, the 3-byte code assignment table 115b keeps the CJK characters, the English words, the Japanese words, the words from third countries, the numerical values, the times, the tags, and the results of syntactic and semantic analyses and the 3-byte codes in correspondence with one another. In the 3-byte code assignment table 115b, for example, the range "E00000h to FFFFFFh" corresponds to a spare region.

In the 3-byte code assignment table 115b, the Japanese words, the words from third countries, the numerical values, the times, the tags, and the results of syntactic and semantic analyses are set in "800000h to DFFFFFh", and 3-byte codes corresponding to the setting positions thereof are assigned thereto. For example, the 3-byte code "800000h" is assigned to the Japanese word set in the setting position "800000h".

Returning to the description of FIG. 2A, the code converting unit 150 is a processing unit that encodes the text data stored in the register 105a, on the basis of the code assignment table 110, the 2-byte code assignment table 115a, and the 3-byte code assignment table 115b. The code converting unit 150 stores the text data resulting from the encoding process, into the register 105b.

In the following sections, an example of a process performed by the code converting unit 150 will be explained. The code converting unit 150 obtains a word separated by the spaces "Δ" from the text data and judges whether the obtained word is one of the words set in the 1-byte region 110A, one of the words set in the 2-byte region 110B, or one of the words set in the 3-byte region 110C.

An example in which the word obtained by the code converting unit 150 is one of the words set in the 1-byte region 110A will be explained. The code converting unit 150 compares the obtained word with the words included in the 1-byte region 110A, identifies the 1-byte code in the corresponding setting position, and encodes the obtained word. For example, when the obtained word is "theΔ", the code converting unit 150 encodes the word "theΔ" into "00h".

Next, an example in which the word obtained by the code converting unit 150 is one of the words set in the 2-byte region 110B will be explained. The code converting unit 150 compares the obtained word with the 2-byte code assignment table 115a, identifies the 2-byte code in the corresponding setting position, and encodes the obtained word. For example, when the obtained word is a certain high-frequency word set in "4000h" in the 2-byte code assignment table 115a, the code converting unit 150 encodes the high-frequency word into the 2-byte code "4000h".

Also, when obtained information is any of the alphanumeric characters, the symbols, the Japanese Hiragana alphabet, the Japanese Katakana alphabet, the Japanese Kanji characters, the numerical values, the times, the tags, and the syntax set in the 2-byte region 110B, the code converting unit 150 compares the obtained information with the 2-byte code assignment table 115a and encodes the obtained information. For example, when having obtained "NULL", the code converting unit 150 encodes "NULL" into "3000h".

Next, an example in which the word obtained by the code converting unit 150 is one of the words set in the 3-byte region 110C will be explained. The code converting unit 150 compares the obtained word with the 3-byte code assignment table 115b, identifies the 3-byte code in the corresponding setting position, and encodes the obtained word. For example, when the obtained word is a certain English word set in "700000h" in the 3-byte code assignment table 115b, the code converting unit 150 encodes the English word into the 3-byte code "700000h".

Also, when obtained information is any of the Japanese words, the words in third countries, the numerical values, the times, the tags, and the result of syntactic and semantic analyses set in the 3-byte region 110C, the code converting unit 150 compares the obtained information with the 3-byte code assignment table 115b and encodes the obtained information. For example, when obtained information is a certain Japanese word set in "800000h" in the 3-byte code assignment table 115b, the code converting unit 150 encodes the Japanese word into the 3-byte code "800000h".

The code converting unit 150 encodes the text data by repeatedly performing the process described above on the text data stored in the register 105a. The code converting unit 150 then stores the text data resulting from the encoding process, into the register 105b.

Figure 2B:
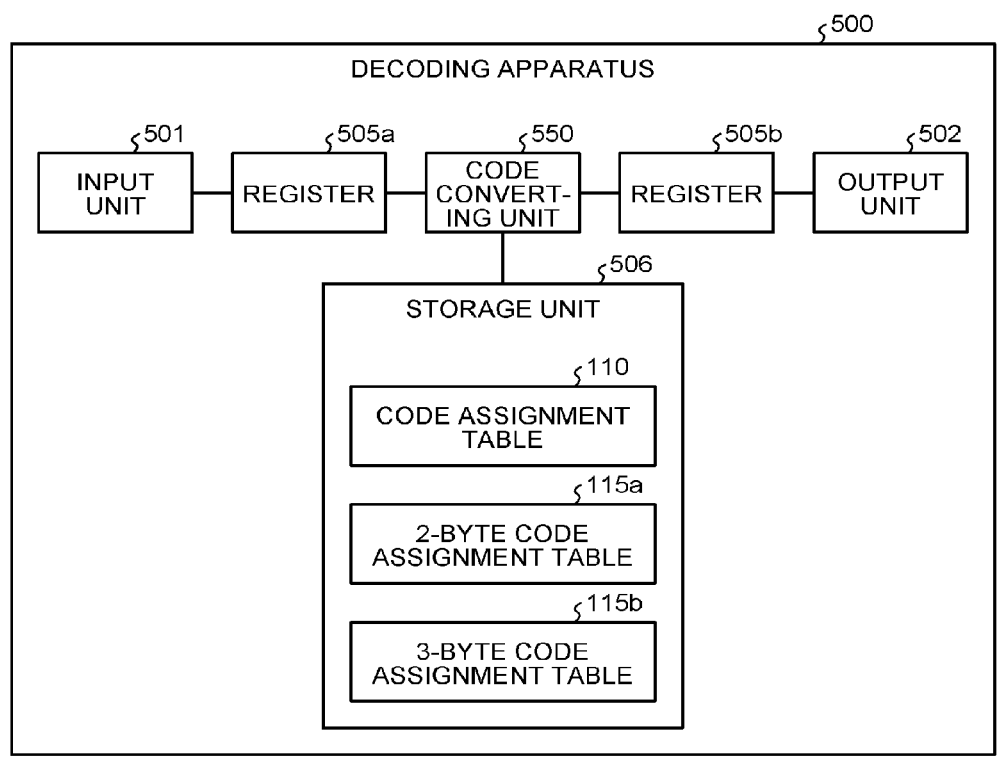
FIG. 2B is a functional block diagram illustrating a configuration of the decoding apparatus according to the first embodiment.

FIG. 2B is a functional block diagram illustrating a configuration of the decoding apparatus according to the first embodiment. As illustrated in FIG. 2B, a decoding apparatus 500 includes an input unit 501, an output unit 502, registers 505a and 505b, a storage unit 506, and a code converting unit 550.

The input unit 501 is a processing unit that receives the text data resulting from the code conversion. The input unit 501 stores the received text data into the register 505a.

The output unit 502 is a processing unit that outputs the text data stored in the register 505b.

The register 505a is for storing therein the text data resulting from the code conversion. The register 505b is for storing therein the text data after the character code conversion.

The storage unit 506 includes the code assignment table 110, the 2-byte code assignment table 115a, and the 3-byte code assignment table 115b. For example, the storage unit 506 corresponds to a storage device configured by using a semiconductor memory element such as a RAM, a ROM, a flash memory, or the like.

The explanation about the code assignment table 110 is the same as the explanation about the code assignment table 110 provided with reference to FIG. 3. The explanation about the 2-byte code assignment table 115a is the same as the explanation about the 2-byte code assignment table 115a provided with reference to FIG. 4. The explanation about the 3-byte code assignment table 115b is the same as the explanation about the 3-byte code assignment table 115b provided with reference to FIG. 5.

In the following sections, an example of a process performed by the code converting unit 550 will be explained. For example, the code converting unit 550 obtains a code from the text data and judges whether the obtained code is a code corresponding to one of the words set in the 1-byte region 110A, a code corresponding to one of the words set in the 2-byte region 110B, or a code corresponding to one of the words set in the 3-byte region 110C.

An example in which the code obtained by the code converting unit 550 is a code corresponding to one of the words set in the 1-byte region 110A will be explained. The first byte of the code corresponding to one of the words set in the 1-byte region 110A is included in the range "00h to 2Fh". The code converting unit 550 selects the word corresponding to the code from among the words set in the 1-byte region 110A and performs a character code conversion with the selected word. For example, when the obtained code is "00h", the code converting unit 550 performs a character code conversion on "00h" and obtains "theΔ".

An example in which the code obtained by the code converting unit 550 is a code corresponding to one of the words set in the 2-byte region 110B will be explained. The first byte of the code corresponding to one of the words set in the 2-byte region 110B is included in the range "30h to 5Fh". The code converting unit 550 compares a code obtained by combining the first byte of the code with the following second byte with the 2-byte code assignment table 115a and performs a character code conversion on the word. For example, when the 2-byte code is "4000h", the code converting unit 550 performs the character code conversion to obtain the word corresponding to "4000h" set in the 2-byte code assignment table 115a.

An example in which the code obtained by the code converting unit 550 is a code corresponding to one of the words set in the 3-byte region 110C will be explained. The first byte of the code corresponding to one of the words set in the 3-byte region 110C is included in the range "60h to FFh". The code converting unit 550 compares a code obtained by combining the first byte of the code with the following second and third bytes with the 3-byte code assignment table 115b and performs a character code conversion on the word. For example, when the 3-byte code is "700000h", the code converting unit 550 performs the character code conversion to obtain the word corresponding to "700000h" set in the 3-byte code assignment table 115b.

FIG. 6A is a flowchart illustrating a processing procedure performed by the encoding apparatus according to the first embodiment. As illustrated in FIG. 6A, the input unit 101 included in the encoding apparatus 100 stores text data into the register 105a (step S101). The code converting unit 150 included in the encoding apparatus 100 obtains a word from the text data stored in the register 105a (step S102). Although the term "word" is used for the sake of convenience in the explanation, the information obtained by the code converting unit 150 at step S102 may be a Japanese word, a word from a third country, a numerical value, a time, a tag, a result of a syntactic and semantic analysis, or the like, instead of a word.

The code converting unit 150 compares the word with the code assignment table 110 (step S103). When the word is a word corresponding to one of the words in the 1-byte region 110A of the code assignment table 110 (step S104: Yes), the code converting unit 150 proceeds to step S105. The code converting unit 150 converts the word into a 1-byte code on the basis of the code assignment table 110 (step S105) and proceeds to step S109.

On the contrary, when the word is not a word corresponding to one of the words in the 1-byte region 110A of the code assignment table 110 (step S104: No), the code converting unit 150 proceeds to step S106. When the word is a word corresponding to one of the words in the 2-byte region 110B of the code assignment table 110 (step S106: Yes), the code converting unit 150 proceeds to step S107. On the basis of the 2-byte code assignment table 115a, the code converting unit 150 converts the word into a 2-byte code (step S107) and proceeds to step S109.

On the contrary, when the word is not a word corresponding to one of the words in the 2-byte region 110B of the code assignment table 110 (step S106: No), the code converting unit 150 proceeds to step S108. On the basis of the 3-byte code conversion table 115b, the code converting unit 150 converts the word into a 3-byte code (step S108) and proceeds to step S109.

The code converting unit 150 judges whether the encoding process on the text data has been finished or not (step S109). When the encoding process on the text data has not been finished (step S109: No), the code converting unit 150 proceeds to step S102.

On the contrary, when the encoding process on the text data has been finished (step S109: Yes), the code converting unit 150 stores the text data resulting from the encoding process, into the register 105b (step S110).

FIG. 6B is a flowchart illustrating a processing procedure performed by the decoding apparatus according to the first embodiment. As illustrated in FIG. 6B, the input unit 501 included in the decoding apparatus 500 stores text data into the register 505a (step S501). The code converting unit 550 included in the decoding apparatus 500 obtains a code from the text data stored in the register 505a (step S502).

The code converting unit 550 compares the code with the code assignment table 110 (step S503). When the code is a code corresponding to one of the words in the 1-byte region 110A of the code assignment table 110 (step S504: Yes), the code converting unit 550 proceeds to step S505. On the basis of the code assignment table 110, the code converting unit 550 converts the 1-byte code into the word (step S505) and proceeds to step S509.

On the contrary, when the code is not a code corresponding to one of the words in the 1-byte region 110A of the code assignment table 110 (step S504: No), the code converting unit 550 proceeds to step S506. When the code is a code corresponding to one of the words in the 2-byte region 110B of the code assignment table 110 (step S506: Yes), the code converting unit 550 proceeds to step S507. On the basis of the 2-byte code assignment table 115a, the code converting unit 550 converts the 2-byte code into the word (step S507) and proceeds to step S509.

On the contrary, when the code is not a code corresponding to one of the words in the 2-byte region 110B of the code assignment table 110 (step S506: No), the code converting unit 550 proceeds to step S508. On the basis of the 3-byte code conversion table 115b, the code converting unit 550 converts the 3-byte code into the word (step S508) and proceeds to step S509.

The code converting unit 550 judges whether the decoding process on the text data has been finished or not (step S509). When the decoding process on the text data has not been finished (step S509: No), the code converting unit 550 proceeds to step S502.

On the contrary, when the decoding process on the text data has been finished (step S509: Yes), the code converting unit 550 stores the text data resulting from the decoding process, into the register 505b (step S510).

Next, an advantageous effect of the encoding apparatus 100 according to the first embodiment will be explained. The encoding apparatus 100 saves the characters assigned to the 1-byte region of the conventional code assignment table 50 into the 2-byte region of the code assignment table 110 and performs the code conversion by using the code assignment table 110 in which the strictly-selected words are assigned to the 1-byte region thereof. By performing the process in this manner, it is possible to assign the short bytecodes to the characters and the words of which the frequency of appearance is high.

Further, the decoding apparatus 500 decodes the encoded text data by using the code assignment table 110 described above. Consequently, even when the short bytecodes are assigned to the words of which the frequency of appearance is high and to the general symbols, it is possible to convert the bytecodes into the words or the general symbols.

[b] Second Embodiment

FIG. 7A is an example of a process performed by an encoding apparatus according to a second embodiment. The encoding apparatus according to the second embodiment generates code-converted text data 20b, by performing a code conversion on text data 20a, by using a code assignment table 210, in place of the code assignment table 50 used in the conventional example. The explanation about the code assignment table 50 in the conventional example is the same as the explanation provided in the first embodiment.

Next, the code assignment table 210 according to the second embodiment will be explained. Predetermined words (explained later) are set in 00h to 1Fh in the code assignment table 210, and a 1-byte code is assigned thereto. The region corresponding to 00h to 1Fh in the code assignment table 210 includes the region in which the control characters are assigned in the code assignment table 50.

Alphanumeric characters are set in 20h to 7Fh in the code assignment table 210, and a 1-byte code is assigned to each of the alphanumeric characters. The alphanumeric characters set in 20h to 7Fh in the code assignment table 210 are the same as the alphanumeric characters set in 20h to 7Fh in the code assignment table 50.

High-frequency words and the like are set in 80h to 9Fh in the code assignment table 210. Further, the control characters set in 00h to 1Fh in the code assignment table 50 and a part of the CJK characters set in 80h to FFh in the code assignment table 50 are set in 80h to 9Fh in the code assignment table 210. A 2-byte code is assigned to each of the high-frequency words, the control characters, and the CJK characters that are set in 80h to 9Fh in the code assignment table 210.

Low-frequency words and the like are set in A0h to FFh in the code assignment table 210. Further, a part of the CJK characters set in 80h to FFh in the code assignment table 50 are set in A0h to FFh in the code assignment table 210.

In the second embodiment, the region corresponding to 00h to 1Fh in the code assignment table 210 will be referred to as a "word 1-byte region" in the explanation below, as appropriate. The region corresponding to 20h to 7Fh in the code assignment table 210 will be referred to as an "alphanumeric 1-byte region". The region corresponding to 80h to 9Fh in the code assignment table 210 will be referred to as a "2-byte region". The region corresponding to A0h to FFh in the code assignment table 210 will be referred to as a "3-byte region".

A code converting unit 250 converts the text data 20a into the text data 20b, on the basis of the code assignment table 210. In the present example, let us assume that the text data 20a reads "heΔisΔinΔtheΔhouseΔ . . . ". The symbol "Δ" in the text data 20a denotes a space.

The code converting unit 250 converts each of the words into a code by comparing the words separated by the spaces "Δ" with the code assignment table 210. The word "heΔ" included in the text data 20a is one of the words set in the word 1-byte region of the code assignment table 210. Thus, the code converting unit 250 converts the word "heΔ" into the 1-byte code "12h".

The word "isΔ" included in the text data 20a is one of the words set in the word 1-byte region of the code assignment table 210. Thus, the code converting unit 250 converts the word "isΔ" into the 1-byte code "08h".

The word "inΔ" included in the text data 20a is one of the words set in the word 1-byte region of the code assignment table 210. Thus, the code converting unit 250 converts the word "inΔ" into the 1-byte code "07h".

The word "theΔ" included in the text data 20a is one of the words set in the word 1-byte region of the code assignment table 210. Thus, the code converting unit 250 converts the word "theΔ" into the 1-byte code "00h".

The word "houseΔ" included in the text data 20a is one of the words set in the 2-byte region of the code assignment table 210. Thus, the code converting unit 250 converts the word "houseΔ" into the 2-byte code "8341h", for example.

The code converting unit 250 encodes the text data 20a into the text data 20b, by performing the process described above on each of the words included in the text data 20a.

FIG. 7B is a drawing of an example of a process performed by a decoding apparatus according to the second embodiment. The decoding apparatus according to the second embodiment generates the text data 20a by performing a character code conversion on the code-converted text data 20b, while using the code assignment table 210, in place of the code assignment table 50 used in the conventional example. The explanation about the code assignment table 210 is the same as the explanation above.

A code converting unit 650 converts the text data 20b into the text data 20a on the basis of the code assignment table 210. In the present example, let us assume that the text data 20b reads " . . . 12h 08h 07h 00h 8341h . . . ".

The code converting unit 650 converts the codes into the words, by comparing the codes with the code assignment table 210. For example, the code converting unit 650 converts the 1-byte code "12h" into the word "heΔ". Further, the code converting unit 650 converts the 1-byte code "08h" into the word "isΔ". Also, the code converting unit 650 converts the 1-byte code "07h" into the word "inΔ". Furthermore, the code converting unit 650 converts the 1-byte code "00h" into the word "theΔ". In addition, the code converting unit 650 converts the 2-byte code "8341h" into the word "houseΔ".

The code converting unit 650 converts the text data 20b into the text data 20a by performing the process described above on each of the codes included in the text data 20b.

Figure 8A:
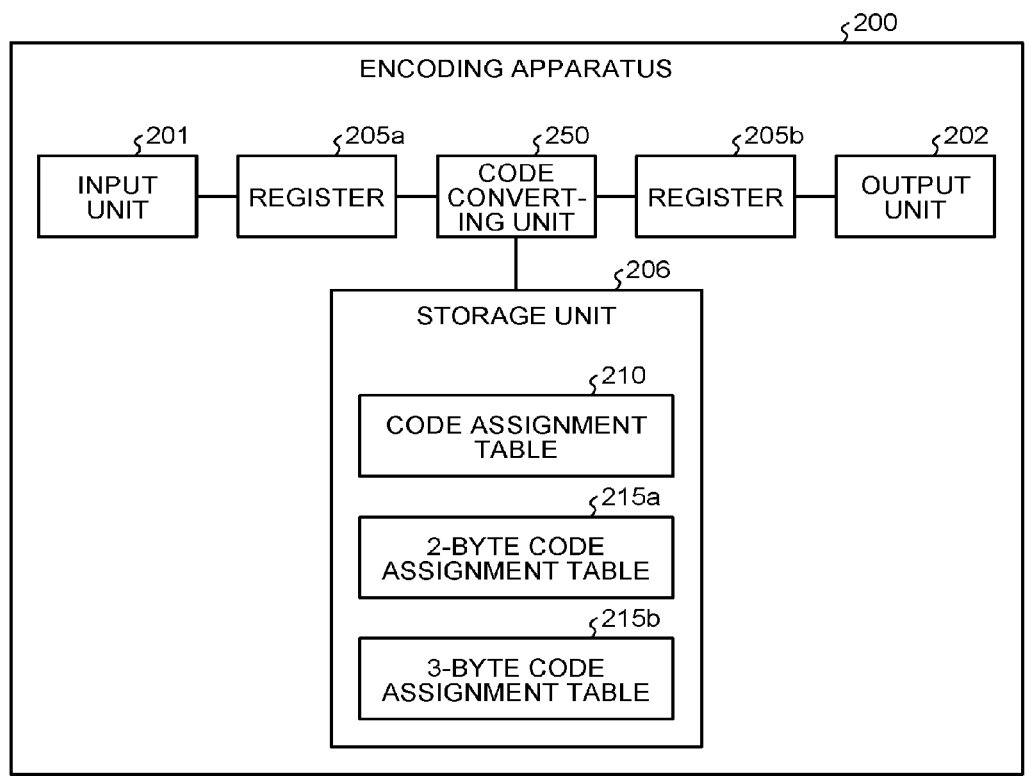
FIG. 8A is a functional block diagram illustrating a configuration of the encoding apparatus according to the second embodiment.

FIG. 8A is a functional block diagram illustrating a configuration of the encoding apparatus according to the second embodiment. As illustrated in FIG. 8A, an encoding apparatus 200 includes an input unit 201, an output unit 202, registers 205a and 205b, a storage unit 206, and the code converting unit 250.

The input unit 201 is a processing unit that receives text data on which the code conversion is to be performed. The input unit 201 stores the received text data into the register 205a.

The output unit 202 is a processing unit that outputs the text data after the code conversion stored in the register 205b.

The register 205a is for storing therein the text data before the code conversion. The register 205b is for storing therein the text data after the code conversion.

The storage unit 206 includes the code assignment table 210, a 2-byte code assignment table 215a, and a 3-byte code assignment table 215b. For example, the storage unit 206 corresponds to a storage device configured by using a semiconductor memory element such as a RAM, a ROM, a flash memory, or the like.

FIG. 9 is a drawing of an example of the code assignment table according to the second embodiment. The code assignment table 210 is a table in which words and the like and the predetermined codes are kept in correspondence with one another and corresponds to the code assignment table 210 explained with reference to FIG. 7A. As illustrated in FIG. 9, the code assignment table 210 includes a word 1-byte region 210A, an alphanumeric 1-byte region 210B, a 2-byte region 210C, and a 3-byte region 210D.

The word 1-byte region 210A is a region corresponding to 00h to 1Fh in the code assignment table 210. In the word 1-byte region 210A, 32 words that have the highest frequency of appearance are set, on the basis of Aozora Bunko, The Oxford English Dictionary, and other general books.

To each of the words set in the word 1-byte region 210A, a 1-byte code corresponding to the setting position thereof in the word 1-byte region 210A is assigned. For example, the 1-byte code "00h" is assigned to the word "theΔ". Similarly, a 1-byte code is assigned to each of the other words set in the word 1-byte region 210A.

The alphanumeric 1-byte region 210B is a region corresponding to 20h to 7Fh in the code assignment table 210. In the alphanumeric 1-byte region 210B, the same alphanumeric characters as those set in 20h to 7Fh in the code assignment table 50 are set.

To each of the alphanumeric characters set in the alphanumeric 1-byte region 210B, a 1-byte code corresponding to the setting position thereof in the alphanumeric 1-byte region 210B is assigned. For example, the 1-byte code "30h" is assigned to the numerical value "0". Similarly, a 1-byte code is assigned to each of the other alphanumeric characters set in the alphanumeric 1-byte region 210B.

The 2-byte region 210C is a region corresponding to 80h to 9Fh in the code assignment table 210. In the 2-byte region 210C, words of which the frequency of appearance is equal to or higher than a predetermined value are set, on the basis of Aozora Bunko, The Oxford English Dictionary, and other general books. In the explanation below, the words of which the frequency of appearance is equal to or higher than the predetermined value will be referred to as "high-frequency words", as appropriate. Further, the 2-byte region 210C may also include control characters, and the like.

In this situation, defined in the 2-byte region 210C are only the 1-byte codes in the first halves of the 2-byte codes assigned to the high-frequency words and the like set in the 2-byte region 210C. The 2-byte codes assigned to the words and the like set in the 2-byte region 210C are defined in the 2-byte code assignment table 215a, which is explained later.

For example, of the 2-byte codes assigned to the high-frequency words in the 2-byte region 210C, the 1-byte codes in the first halves are "80h to 9Fh". Further, the 1-byte codes in the first halves and the remaining 1-byte codes are defined in the 2-byte code assignment table 215a.

The 3-byte region 210D is a region corresponding to A0h to FFh in the code assignment table 210. In the 3-byte region 210D, words of which the frequency of appearance is lower than the predetermined value are set, on the basis of Aozora Bunko, The Oxford English Dictionary, and other general books. For example, the 3-byte region 210D includes CJK characters, English words, Japanese words, numerical values, tags, dynamic codes, and the like. The dynamic codes correspond to, for example, people's names, addresses, joined words, and the like.

In this situation, defined in the 3-byte region 210D are only the 1-byte codes in the first halves of the 3-byte codes assigned to the words and the like set in the 3-byte region 210D. The 3-byte codes assigned to the words and the like set in the 3-byte region 210D are defined in the 3-byte code assignment table 215b, which is explained later.

FIG. 10 is a drawing of an example of the 2-byte code assignment table according to the second embodiment. As illustrated in FIG. 10, the 2-byte code assignment table 215a keeps the high-frequency words and the 2-byte codes in correspondence with one another.

For example, in the 2-byte code assignment table 215a, the high-frequency words are set in "8000h to 9FFFh", and 2-byte codes corresponding to the setting positions thereof are assigned thereto. For example, the 2-byte code "8000h" is assigned to the high-frequency word set in the setting position "8000h".

FIG. 11 is a drawing of an example of the 3-byte code assignment table according to the second embodiment. As illustrated in FIG. 11, the 3-byte code assignment table 215b keeps the CJK characters, the English words, the Japanese words, the numerical values, the tags, and the dynamic codes and the 3-byte codes in correspondence with one another.

Returning to the description of FIG. 8A, the code converting unit 250 is a processing unit that encodes the text data stored in the register 205a, on the basis of the code assignment table 210, the 2-byte code assignment table 215a, and the 3-byte code assignment table 215b. The code converting unit 250 stores the text data resulting from the encoding process, into the register 205b.

In the following sections, an example of a process performed by the code converting unit 250 will be explained. The code converting unit 250 obtains a word separated by the spaces "Δ" from the text data. The code converting unit 250 judges whether the obtained word is one of the words set in the word 1-byte region 210A, a character corresponding to one of the alphanumeric characters set in the alphanumeric 1-byte region 210B, one of the words set in the 2-byte region 210C, or one of the words set in the 3-byte region 210D.

An example in which the word obtained by the code converting unit 250 is one of the words set in the word 1-byte region 210A will be explained. The code converting unit 250 compares the obtained word with the words included in the word 1-byte region 210A, identifies the 1-byte code in the corresponding setting position, and encodes the obtained word. For example, when the obtained word is "theΔ", the code converting unit 250 encodes the word "theΔ" into "00h".

Next, an example in which the information obtained by the code converting unit 250 is one of the alphanumeric characters set in the alphanumeric 1-byte region 210B will be explained. The code converting unit 250 compares the obtained alphanumeric character with the alphanumeric characters included in the alphanumeric 1-byte region 210B, identifies the 1-byte code in the corresponding setting position, and encodes the obtained alphanumeric character. For example, when the obtained alphanumeric character is "Δ", the code converting unit 250 encodes the alphanumeric character "Δ" into "41h".

An example in which the word obtained by the code converting unit 250 is one of the words set in the 2-byte region 210C will be explained. The code converting unit 250 compares the obtained word with the 2-byte code assignment table 215a, identifies the 2-byte code in the corresponding setting position, and encodes the obtained word. For example, when the obtained word is a certain high-frequency word set in "8000h" in the 2-byte code assignment table 215a, the code converting unit 250 encodes the high-frequency word into the 2-byte code "8000h".

An example in which the word obtained by the code converting unit 250 is one of the words set in the 3-byte region 210D will be explained. The code converting unit 250 compares the obtained word with the 3-byte code assignment table 215b, identifies the 3-byte code in the corresponding setting position, and encodes the obtained word. For example, when obtained word is a certain English word set in "B00000h" in the 3-byte code assignment table 215b, the code converting unit 250 encodes the English word into the 3-byte code "B00000h".

Also, when the obtained information is any of the Japanese words, the CJK characters, the numerical values, the tags, and the dynamic codes set in the 3-byte region 210D, the code converting unit 250 compares the obtained information with the 3-byte code assignment table 215b and encodes the obtained information.

Figure 8B:
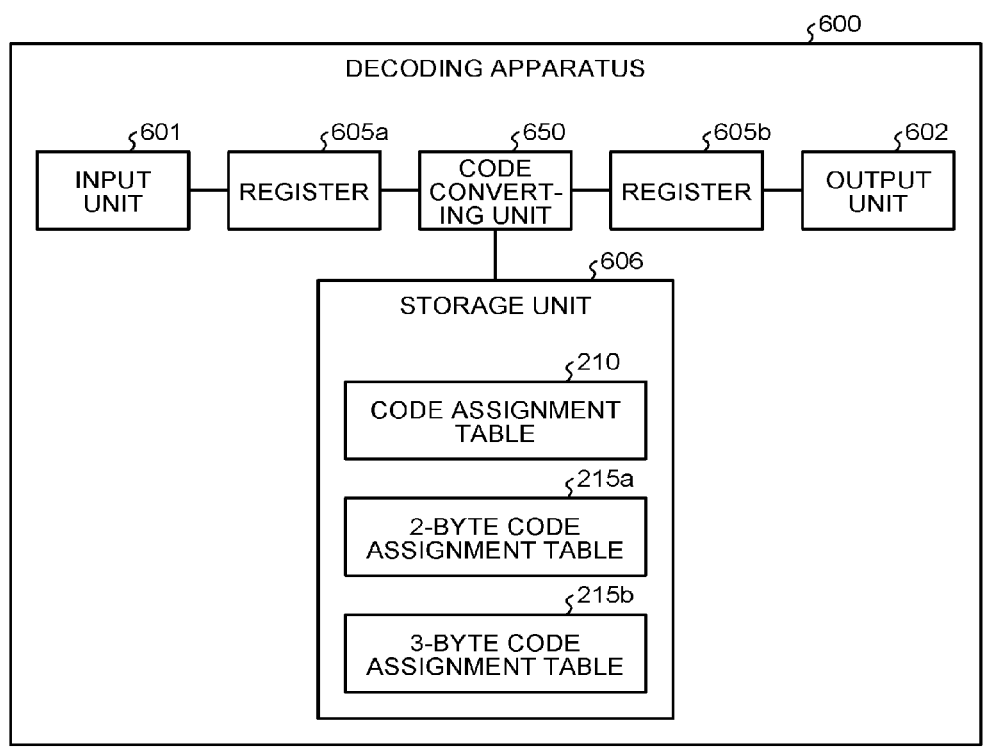
FIG. 8B is a functional block diagram illustrating a configuration of the decoding apparatus according to the second embodiment.

FIG. 8B is a functional block diagram illustrating a configuration of the decoding apparatus according to the second embodiment. As illustrated in FIG. 8B, a decoding apparatus 600 includes an input unit 601, an output unit 602, registers 605a and 605b, a storage unit 606, and a code converting unit 650.

The input unit 601 is a processing unit that receives the text data resulting from the code conversion. The input unit 601 stores the received text data into the register 605a.

The output unit 602 is a processing unit that outputs the text data stored in the register 605b.

The register 605a is for storing therein the text data resulting from the code conversion. The register 605b is for storing therein the text data after the character code conversion.

The storage unit 606 includes the code assignment table 210, the 2-byte code assignment table 215a, and the 3-byte code assignment table 215b. For example, the storage unit 606 corresponds to a storage device configured by using a semiconductor memory element such as a RAM, a ROM, a flash memory, or the like.

The explanation about the code assignment table 210 is the same as the explanation about the code assignment table 210 provided with reference to FIG. 9. The explanation about the 2-byte code assignment table 215a is the same as the explanation about the 2-byte code assignment table 215a provided with reference to FIG. 10. The explanation about the 3-byte code assignment table 215b is the same as the explanation about the 3-byte code assignment table 215b provided with reference to FIG. 11.

In the following sections, an example of a process performed by the code converting unit 650 will be explained. For example, the code converting unit 650 obtains a code from the text data and judges whether the obtained code is a code corresponding to one of the words set in the word 1-byte region 210A or a code corresponding to one of the alphanumeric characters set in the alphanumeric 1-byte region 210B. Further, the code converting unit 650 judges whether the obtained code is a code corresponding to one of the words set in the 2-byte region 210C or a code corresponding to one of the words set in the 3-byte region 210D.

An example in which the code obtained by the code converting unit 650 is a code corresponding to one of the words set in the word 1-byte region 210A will be explained. The first byte of the code corresponding to one of the words set in the word 1-byte region 210A is included in the range "00h to 1Fh". The code converting unit 650 selects the word corresponding to the code from among the words set in the word 1-byte region 210A and performs a character code conversion with the selected word. For example, when the obtained code is "00h", the code converting unit 650 performs a character code conversion on "00h" and obtains "theΔ".

An example in which the code obtained by the code converting unit 650 is a code corresponding to one of the alphanumeric characters set in the alphanumeric 1-byte region 210B will be explained. The first byte of the code corresponding to one of the alphanumeric characters set in the alphanumeric 1-byte region 210B is included in the range "20h to 7Fh". The code converting unit 650 selects the alphanumeric character corresponding to the code from among the alphanumeric characters set in the alphanumeric 1-byte region 210b and performs a character code conversion with the selected alphanumeric character. For example, when the obtained code is "41h", the code converting unit 650 performs a character code conversion on "41h" and obtains "Δ".

An example in which the code obtained by the code converting unit 650 is a code corresponding to one of the words set in the 2-byte region 210C will be explained. The first byte of the code corresponding to one of the words set in the 2-byte region 210C is included in the range "80h to 9Fh". The code converting unit 650 compares the obtained code with the 2-byte code assignment table 215a, identifies the word corresponding to the code, and performs a character code conversion. When the obtained code is "8000h", the code converting unit 650 performs the character code conversion to obtain the high-frequency word corresponding to "8000h" set in the 2-byte code assignment table 215a.

An example in which the code obtained by the code converting unit 650 is a code corresponding to one of the words set in the 3-byte region 210S will be explained. The first byte of the code corresponding to one of the words set in the 3-byte region 210D is included in the range "A0h to FFh". The code converting unit 650 compares the obtained code with the 3-byte code assignment table 215b, identifies the word corresponding to the code, and performs a character code conversion. When the obtained code is "B00000h", the code converting unit 650 performs the character code conversion to obtain the English word corresponding to "B00000h" set in the 3-byte code assignment table 215b.

FIG. 12A is a flowchart illustrating a processing procedure performed by the encoding apparatus according to the second embodiment. As illustrated in FIG. 12A, the input unit 201 included in the encoding apparatus 200 stores text data into the register 205a (step S201). The code converting unit 250 included in the encoding apparatus 200 obtains a word from the text data stored in the register 205a (step S202). Although the term "word" is used for the sake of convenience in the explanation, the information obtained by the code converting unit 250 at step S202 may be an alphanumeric character, a CJK character, a Japanese word, an English word, a numerical value, a tag, or a dynamic code, instead of a word.

The code converting unit 250 compares the word with the code assignment table 210 (step S203). When the word (the information) is a word corresponding to one of the words in the word 1-byte region 210A or one of the alphanumeric characters in the alphanumeric 1-byte region 210B of the code assignment table 210 (step S204: Yes), the code converting unit 250 proceeds to step S205. The code converting unit 250 converts the word or the alphanumeric character into a 1-byte code on the basis of the code assignment table 210 (step S205) and proceeds to step S209.

On the contrary, when the word (the information) is neither a word corresponding to one of the words in the word 1-byte region 210A nor a word corresponding to one of the alphanumeric characters in the alphanumeric 1-byte region 210B of the code assignment table 210 (step S204: No), the code converting unit 250 proceeds to step S206. When the word is a word corresponding to one of the words in the 2-byte region 210C of the code assignment table 210 (step S206: Yes), the code converting unit 250 proceeds to step S207. On the basis of the 2-byte code assignment table 215a, the code converting unit 250 converts the word into a 2-byte code (step S207) and proceeds to step S209.

On the contrary, when the word is not a word corresponding to one of the words in the 2-byte region 210C of the code assignment table 210 (step S206: No), the code converting unit 250 proceeds to step S208. On the basis of the 3-byte code assignment table 215b, the code converting unit 250 converts the word into a 3-byte code (step S208) and proceeds to step S209.

The code converting unit 250 judges whether the encoding process on the text data has been finished or not (step S209). When the encoding process on the text data has not been finished (step S209: No), the code converting unit 250 proceeds to step S202.

On the contrary, when the encoding process on the text data has been finished (step S209: Yes), the code converting unit 250 stores the text data resulting from the encoding process, into the register 205b (step S210).

FIG. 12B is a flowchart illustrating a processing procedure performed by the decoding apparatus according to the second embodiment. As illustrated in FIG. 12B, the input unit 601 included in the decoding apparatus 600 stores text data into the register 605a (step S601). The code converting unit 650 included in the decoding apparatus 600 obtains a code from the text data stored in the register 605a (step S602).

The code converting unit 650 compares the code with the code assignment table 210 (step S603). When the code is a code corresponding to one of the words in the word 1-byte region 210A or one of the alphanumeric characters in the alphanumeric 1-byte region 210B of the code assignment table 210 (step S604: Yes), the code converting unit 650 proceeds to step S605. On the basis of the code assignment table 210, the code converting unit 650 converts the 1-byte code into the word or the alphanumeric character (step S605) and proceeds to step S609.

On the contrary, when the code is neither a code corresponding to one of the words in the word 1-byte region 210A nor a code corresponding to one of the alphanumeric characters in the alphanumeric 1-byte region 210B of the code assignment table 210 (step S604: No), the code converting unit 650 proceeds to step S606. When the code is a code corresponding to one of the words in the 2-byte region 210C of the code assignment table 210 (step S606: Yes), the code converting unit 650 proceeds to step S607. On the basis of the 2-byte code assignment table 215a, the code converting unit 650 converts the 2-byte code into the word (step S607) and proceeds to step S609.

On the contrary, when the code is not a code corresponding to one of the words in the 2-byte region 210C of the code assignment table 210 (step S606: No), the code converting unit 650 proceeds to step S608. On the basis of the 3-byte code assignment table 215b, the code converting unit 650 converts the 3-byte code into the word (step S608) and proceeds to step S609.

The code converting unit 650 judges whether the decoding process on the text data has been finished or not (step S609). When the decoding process on the text data has not been finished (step S609: No), the code converting unit 250 proceeds to step S602.

On the contrary, when the decoding process on the text data has been finished (step S609: Yes), the code converting unit 250 stores the text data resulting from the decoding process, into the register 605b (step S610).

Next, an advantageous effect of the encoding apparatus 200 according to the second embodiment will be explained. The encoding apparatus 200 performs the code conversion by using the code assignment table 210 in which the strictly-selected words are assigned to the word 1-byte region thereof. In the alphanumeric 1-byte region, the same alphanumeric characters as those set in 20h to 7Fh of the conventional code assignment table 50 are set. By performing the process in this manner, it is possible to assign the short bytecodes to the characters and the words of which the frequency of appearance is high, while making it possible to convert any of the alphanumeric characters to a 1-byte code in the same manner as in the conventional example.

Further, the decoding apparatus 600 decodes the encoded text data by using the code assignment table 210 described above. Consequently, even when the short bytecodes are assigned to the words of which the frequency of appearance is high and to the general symbols, it is possible to convert the bytecodes into the words or the general symbols.

[c] Third Embodiment

Figure 13A:
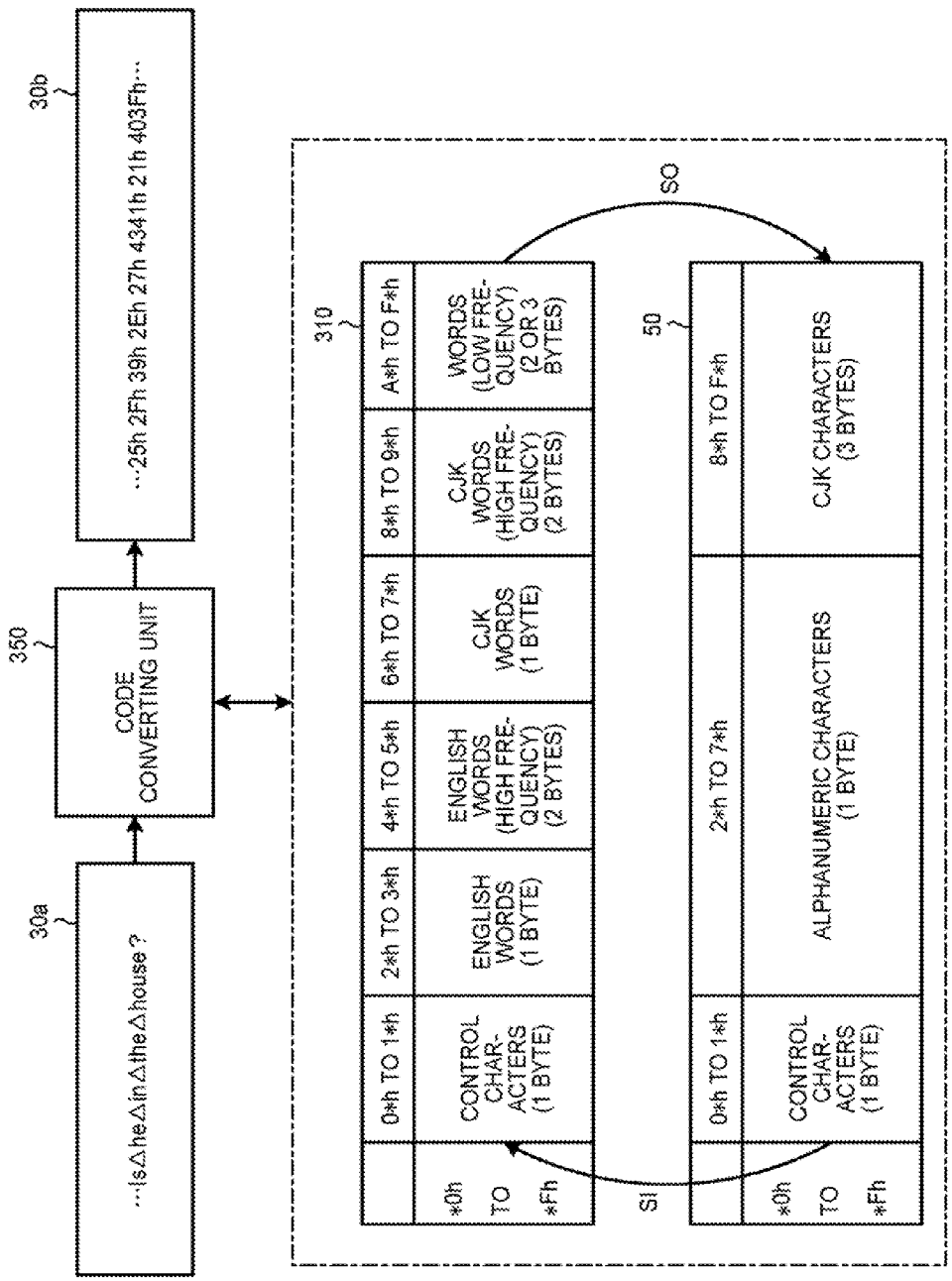
FIG. 13A is a drawing of an example of a process performed by an encoding apparatus according to a third embodiment.

FIG. 13A is a drawing of an example of a process performed by an encoding apparatus according to a third embodiment. The encoding apparatus according to the third embodiment uses code assignment tables by switching between the conventional code assignment table 50 and a code assignment table 310 that is specific to the third embodiment. For example, when having detected a control character "SI (Shift In)" from text data, the encoding apparatus performs a code conversion on the text data including and following the control character "SI", by using the code assignment table 310. In contrast, when having detected a control character "SO (Shift Out)" from text data, the encoding apparatus performs a code conversion by using the code assignment table 50. The explanation about the code assignment table 50 used in the conventional example is the same as the explanation provided in the first embodiment.

The code assignment table 310 will be explained. Control characters are set in 00h to 1Fh in the code assignment table 310, and a 1-byte code is assigned to each of the control characters. The control characters set in 00h to 1Fh in the code conversion table 310 is the same as the control characters set in 00h to 1Fh in the code assignment table 50.

Predetermined English words (explained later) are set in 20h to 3Fh in the code assignment table 310, and a 1-byte code is assigned to each of the English words. High-frequency English words are set in 40h to 5Fh in the code assignment table 310, and a 2-byte code is assigned to each of the high-frequency English words.

Predetermined Japanese words (explained later) are set in 60h to 7Fh in the code assignment table 310, and a 1-byte code is assigned to each of the Japanese words. High-frequency Japanese words are set in 80h to 9Fh in the code assignment table 310.

Low-frequency words are set in A0h to FFh in the code assignment table 310 and a 2- or 3-byte code is assigned to each of the low-frequency words.

In the third embodiment, the region corresponding to 00h to 1Fh in the code assignment table 310 will be referred to as a "control character 1-byte region" in the explanation below, as appropriate. The region corresponding to 20h to 3Fh in the code assignment table 310 will be referred to as an "English word 1-byte region". The region corresponding to 40h to 5Fh in the code assignment table 310 will be referred to as an "English word 2-byte region". The region corresponding to 60h to 7Fh in the code assignment table 310 will be referred to as a "Japanese word 1-byte region". The region corresponding to 80h to 9Fh in the code assignment table 310 will be referred to as a "Japanese word 2-byte region". The region corresponding to A0h to FFh in the code assignment table 310 will be referred to as a "2-/3-byte region".

When having detected the control character "SI" or "SO", a code converting unit 350 switches between the code assignment tables 50 and 310 and converts text data 30*a* into text data 30*b* on the basis of the code assignment table being switched to. In the present example, let us assume that the text data 30*a* reads " . . . Is△he△in△the△house?".

In the following sections, an example will be explained on the premise that the code converting unit 350 has detected the control character "SI" and performs a code conversion on the text data 30*a* on the basis of the code assignment table 310. The process performed by the code converting unit 350 to apply a code conversion to the text data 30*a* on the basis of the code assignment table 50 is the same as that in the conventional example. Thus, the explanation thereof will be omitted.

The code converting unit 350 converts each of the words into a code by comparing the words separated by the spaces "△" with the code assignment table 310. The word "Is△" included in the text data 30*a* is one of the words set in the English word 1-byte region of the code assignment table 310. Thus, the code converting unit 350 converts the word "Is△" into 1-byte codes "25h" and "2Fh". In this situation, the 1-byte code "25h" is a 1-byte code indicating that the initial letter of the word is a capital. The code "2Fh" is a 1-byte code corresponding to "is△".

The word "he△" included in the text data 30*a* is one of the words set in the English word 1-byte region of the code assignment table 310. Thus, the code converting unit 350 converts the word "he△" into the 1-byte code "39h".

The word "in△" included in the text data 30*a* is one of the words set in the English word 1-byte region of the code assignment table 310. Thus, the code converting unit 350 converts the word "in△" into the 1-byte code "2Eh".

The word "the△" included in the text data 30*a* is one of the words set in the English word 1-byte region of the code assignment table 310. Thus, the code converting unit 350 converts the word "the△" into the 1-byte code "27h".

The word "house" included in the text data 30*a* is divided into "house△" and "-△". The word "house△" is one of the words set in the 2-byte region of the code assignment table 310. For example, the code converting unit 350 converts the word "house△" into the 2-byte code "4341h" and converts the word "-△" into the 1-byte code "21h".

The word "?" included in the text data 30*a* is a symbol set in the English word 2-byte region of the code assignment table 310. For example, the code converting unit 350 converts the word "?" into the 2-byte code "403Fh".

By performing the process described above on each of the words included in the text data 30*a*, the code converting unit 350 encodes the text data 30*a* into the text data 30*b*.

Figure 13B:
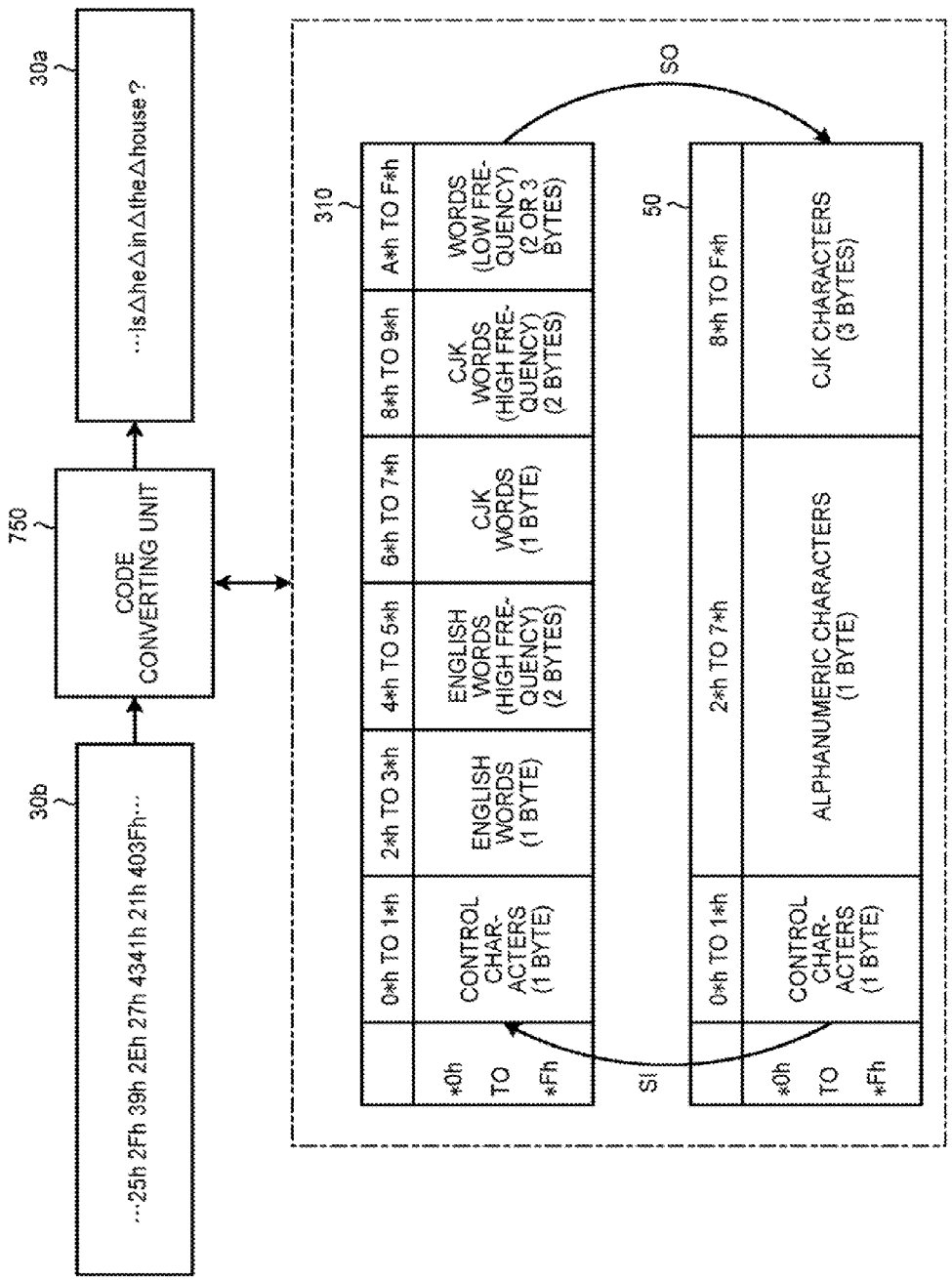
FIG. 13B is a drawing of an example of a process performed by a decoding apparatus according to a third embodiment.

FIG. 13B is a drawing of an example of a process performed by a decoding apparatus according to the third embodiment. The decoding apparatus according to the third embodiment uses code assignment tables by switching between the conventional code assignment table 50 and the code assignment table 310 that is specific to the third embodiment. For example, when having detected a code corresponding to the control character "SI" from text data, the decoding apparatus performs a character code conversion on the text data including and following the control character "SI", by using the code assignment table 310. In contrast, when having detected a code corresponding to the control character "SO" from text data, the decoding apparatus performs a character code conversion by using the code assignment table 50. The explanation about the code assignment table 50 used in the conventional example is the same as the explanation provided in the first embodiment. The explanation about the code assignment table 310 is the same as above.

When having detected the code corresponding to the control character "SI" or the code corresponding to the control character "SO", a code converting unit 750 switches between the code assignment tables 50 and 310 and converts the text data 30*b* into the text data 30*a* on the basis of the code assignment table being switched to. In the present example, let us assume that the text data 30*b* reads " . . . 25h 2Fh 39h 2Eh 27h 4341h 21h 403Fh . . . ".

In the following sections, an example will be explained on the premise that the code converting unit 750 has detected the code corresponding to the control character "SI" and performs a character code conversion on the text data 30*b* on the basis of the code assignment table 310. The process performed by the code converting unit 750 to apply a character code conversion to the text data 30*b* on the basis of the code assignment table 50 is the same as that in the conventional example. Thus, the explanation thereof will be omitted.

The code converting unit 750 converts each of the codes into a word by comparing the codes with the code assignment table 310. For example, the code converting unit 750 converts the 1-byte codes "25h" and "2Fh" into the word "IsΔ". The code converting unit 750 converts the 1-byte code "39h" into the word "heΔ". The code converting unit 750 converts the 1-byte code "2Eh" into the word "inΔ". The code converting unit 750 converts the 1-byte code "27h" into the word "theΔ". The code converting unit 750 converts the 2-byte code "4341h" and the 1-byte code "21h" into the word "house". The code converting unit 750 converts the 2-byte code "403Fh" into the symbol "?".

By performing the process described above on each of the codes included in the text data 30b, the code converting unit 750 performs a character code conversion on the text data 30b and obtains the text data 30a.

Figure 14A:
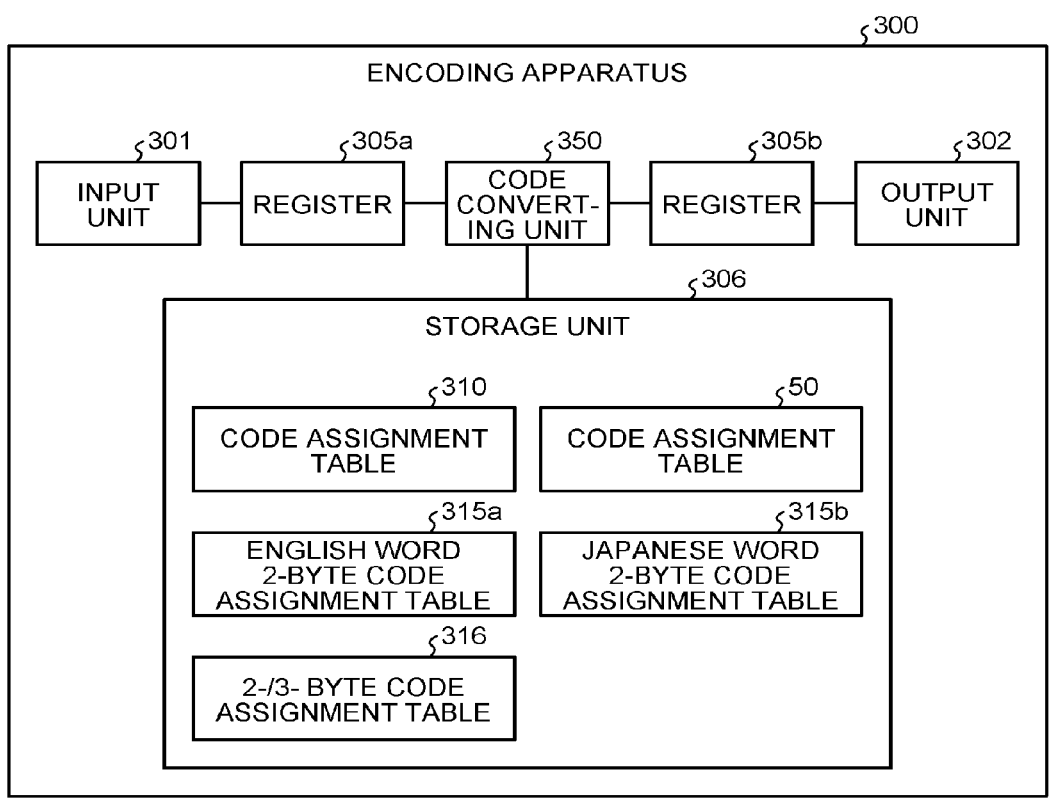
FIG. 14A is a functional block diagram illustrating a configuration of the encoding apparatus according to the third embodiment.

FIG. 14A is a functional block diagram illustrating a configuration of the encoding apparatus according to the third embodiment. As illustrated in FIG. 14A, an encoding apparatus 300 includes an input unit 301, an output unit 302, registers 305a and 305b, a storage unit 306, and the code converting unit 350.

The input unit 301 is a processing unit that receives text data on which the code conversion is to be performed. The input unit 301 stores the received text data into the register 305a.

The output unit 302 is a processing unit that outputs the text data after the code conversion stored in the register 305b.

The register 305a is for storing therein the text data before the code conversion. The register 305b is for storing therein the text data after the code conversion.

The storage unit 306 includes the code assignment table 50, the code assignment table 310, an English word 2-byte code assignment table 315a, a Japanese word 2-byte code assignment table 315b, and a 2-/3-byte code assignment table 316. For example, the storage unit 306 corresponds to a storage device configured by using a semiconductor memory element such as a RAM, a ROM, a flash memory, or the like.

The code assignment table 50 is the conventional code assignment table. For example, the explanation about the code assignment table 50 is the same as the explanation provided in the first embodiment.

FIG. 15 is a drawing of an example of the code assignment table according to the third embodiment. The code assignment table 310 is a table in which the words and the like and the predetermined codes are kept in correspondence with one another and corresponds to the code assignment table 310 explained with reference to FIG. 13A. As illustrated in FIG. 15, the code assignment table 310 includes a control character 1-byte region 310A, an English word 1-byte region 310B, an English word 2-byte region 310C, a Japanese word 1-byte region 310D, a Japanese word 2-byte region 310E, and a 2-/3-byte region 310F.

The control character 1-byte region 310A is a region corresponding to 00h to 1Fh in the code assignment table 310. The control characters set in the control character 1-byte region 310A are the same as the control characters set in 00h to 1Fh in the code assignment table 50. In this situation, the control characters include "SO" and "SI". The control character "SO" is a control character that instructs the code converting unit 350 to perform a code conversion by using the code assignment table 50. The control character "SI" is a control character that instructs the code converting unit 350 to perform a code conversion by using the code assignment table 310.

The English word 1-byte region 310B is a region corresponding to 20h to 3Fh in the code assignment table 310. A 1-byte code is assigned to each of the English words set in the English word 1-byte region 310B. In the English word 1-byte region 310B, 25 English words that have the highest frequency of appearance are set, on the basis of *The Oxford English Dictionary* and other general books. For example, the 1-byte code "27h" is assigned to the word "the".

Further, in the English word 1-byte region 310B, the space "Δ", the backspace "–Δ", the comma ",", the apostrophe "'", a code indicating that the initial letter of a word is a capital, and a code indicating that all the letters in a word are each a capital. For example, the 1-byte code "20h" is assigned to the space "Δ".

The English word 2-byte region 310C is a region corresponding to 40h to 5Fh in the code assignment table 310. English words of which the frequency of appearance is equal to or higher than a predetermined value are set in the English word 2-byte region 310C, on the basis of *The Oxford English Dictionary* and other general books. In the explanation below, the words of which the frequency of appearance is equal to or higher than the predetermined value will be referred to as "high-frequency English words", as appropriate.

In this situation, defined in the English word 2-byte region 310C are only the 1-byte codes in the first halves of the 2-byte codes assigned to the high-frequency English words set in the English word 2-byte region 310C. The 2-byte codes assigned to the English words set in the English word 2-byte region 310C are defined in the English word 2-byte code assignment table 315a, which is explained later.

The Japanese word 1-byte region 310D is a region corresponding to 60h to 7Fh in the code assignment table 310. Japanese words that have the highest frequency of appearance are set in the Japanese word 1-byte region 310D on the basis of Aozora Bunko and other general books. For example, the 1-byte code "65h" is assigned to the Japanese word "no".

Further, the Japanese comma, the Japanese period, and the Japanese quotation marks are set in the Japanese word 1-byte region 310D. For example, the 1-byte code "61h" is assigned to the Japanese comma.

The Japanese word 2-byte region 310E is a region corresponding to 80h to 9Fh in the code assignment table 310. Japanese words that have the highest frequency of appearance are set in the Japanese word 2-byte region 310E on the basis of Aozora Bunko and other general books. In the explanation below, the words of which the frequency of appearance is equal to or higher than the predetermined value will be referred to as "high-frequency Japanese words", as appropriate.

In this situation, set in the Japanese word 2-byte region 310E are only the 1-byte codes in the first halves of the 2-byte codes assigned to the high-frequency Japanese words set in the Japanese word 2-byte region 310E. The 2-byte codes assigned to the Japanese words set in the Japanese word 2-byte region 310E are defined in the Japanese word 2-byte code assignment table 315b, which is explained later.

The 2-/3-byte region 310F is a region corresponding to A0h to FFh in the code assignment table 310. Low-frequency words of which the frequency of appearance is lower than the predetermined value are set in the 2-/3-byte region 310F, on the basis of *Aozora Bunko*, *The Oxford English Dictionary*, and other general books. In the explanation below, the words of low frequency will be referred to as "low-frequency words", as appropriate. A 2-byte or 3-byte code is assigned to each of the low-frequency words set in the 2-/3-byte region 310F.

In this situation, set in the 2-/3-byte region 310F are only the 1-byte codes in the first halves of the bytecodes assigned to the words set in the 2-/3-byte region 310F. The 2-byte or 3-byte codes assigned to the words set in the 2-/3-byte region 310F are defined in the 2-/3-byte code assignment table 316, which is explained later.

FIG. 16 is a drawing of an example of the English word 2-byte code assignment table according to the third embodiment. As illustrated in FIG. 16, the English word 2-byte code assignment table 315a keeps the high-frequency English words and the 2-byte codes in correspondence with one another.

In the English word 2-byte code assignment table 315a, the high-frequency English words are set in the range "4000h to 5FFFh", and 2-byte codes corresponding to the setting positions thereof are assigned thereto. For example, the 2-byte code "4000h" is assigned to the high-frequency English word set in the setting position "4000h".

FIG. 17 is a drawing of an example of a Japanese word 2-byte assignment table according to the third embodiment. As illustrated in FIG. 17, the Japanese word 2-byte code assignment table 315b keeps the high-frequency Japanese words and the 2-byte codes in correspondence with one another.

In the Japanese word 2-byte code assignment table 315b, the high-frequency Japanese words are set in the range "8000h to 9FFFh", and 2-byte codes corresponding to the setting positions thereof are assigned thereto. For example, the 2-byte code "8000h" is assigned to the high-frequency Japanese word set in the setting position "8000h".

FIG. 18 is a drawing of an example of a 2-/3-byte assignment table according to the third embodiment. As illustrated in FIG. 18, the 2-/3-byte code assignment table 316 assigns the low-frequency words and the 2-byte or 3-byte codes. For example, 2-byte codes are assigned to the low-frequency words set in the ranges A000h to E7FFh and F000h to F7FFh. In contrast, 3-bytes codes are assigned to the low-frequency words set in the ranges E90000h to EFFFFFh and F90000h to FFFFFFh.

Returning to the description of FIG. 14A, the code converting unit 350 is a processing unit that switches between the code assignment tables on the basis of control characters and that encodes text data on the basis of the code assignment table being switched to. The code converting unit 350 performs a code conversion on the text data including and following the control character "SI", by using the code assignment table 310. In contrast, when having detected the control character "SO" from text data, the encoding apparatus 300 performs a code conversion by using the code assignment table 50. The explanation about the code assignment table 50 in the conventional example is the same as the explanation provided in the first embodiment. The code converting unit 350 stores the text data resulting from the encoding process, into the register 305b.

In the following sections, an example of an encoding process performed by the code converting unit 350 by using the code assignment table 310 will be explained. The code converting unit 350 obtains information (an English word, a Japanese word, a control character, or the like) from the text data. The code converting unit 350 identifies one of the regions from among the regions 310A to 310F in which the information corresponding to the information obtained from the text data is set and further performs the encoding process corresponding to the identified region.

An example in which the information obtained by the code converting unit 350 is one of the control characters set in the control character 1-byte region 310A will be explained. The code converting unit 350 compares the obtained control character with the control characters set in the control character 1-byte region 310A, identifies the 1-byte code in the corresponding setting position, and encodes the obtained control character. For example, when the obtained control character is "NUL", the code converting unit 350 encodes the control character "NUL" into "00h".

When the obtained control character is "SO", the code converting unit 350 encodes the control character "SO" into the code "0Eh" and also switches the code assignment table to be used, into the code assignment table 50.

When the obtained control character is "SI", the code converting unit 350 encodes the control character "SI" into the code "0Fh" and also switches the code assignment table to be used, into the code assignment table 310.

An example in which the information obtained by the code converting unit 350 is one of the English words set in the English word 1-byte region 310B will be explained. The code converting unit 350 compares the obtained English word with the English words set in the English word 1-byte region 310B, identifies the 1-byte code in the corresponding setting position, and encodes the obtained English word. For example, when the obtained English word is "the", the code converting unit 350 encodes the English word "the" into the code "27h".

An example in which the information obtained by the code converting unit 350 is one of the English words set in the English word 2-byte region 310C will be explained. The code converting unit 350 compares the obtained English word with the English word 2-byte code assignment table 315a, identifies the 2-byte code in the corresponding setting position, and encodes the obtained English word. For example, when the obtained word is a certain high-frequency English word set in "4000h" in the English word 2-byte code assignment table 315a, the code converting unit 350 encodes the high-frequency English word into the 2-byte code "4000h".

An example in which the information obtained by the code converting unit 350 is one of the Japanese words set in the Japanese word 1-byte region 310D will be explained. The code converting unit 350 compares the obtained Japanese word with the Japanese words set in the Japanese word 1-byte region 310D, identifies the 1-byte code in the corresponding setting position, and encodes the obtained Japanese word. For example, when the obtained Japanese word is "no", the code converting unit 350 encodes the Japanese word "no" into the code "65h".

An example in which the information obtained by the code converting unit 350 is one of the Japanese words set in the Japanese word 2-byte region 310E will be explained. The code converting unit 350 compares the obtained Japanese word with the Japanese word 2-byte code assignment table 315b, identifies the 2-byte code in the corresponding setting position, and encodes the Japanese word. For example, when the obtained word is a certain high-frequency Japanese word set in "8000h" in the Japanese word 2-byte code assignment table 315b, the code converting unit 350 encodes the high-frequency Japanese word into the 2-byte code "8000h".

An example in which the information obtained by the code converting unit 350 is one of the low-frequency words set in the 2-/3-byte region 310F will be explained. The code converting unit 350 compares the obtained word with the 2-/3-byte code assignment table 316, identifies the 2-byte or 3-byte code in the corresponding setting position, and encodes the obtained word. For example, when the obtained word is the low-frequency word set in "A000h" in the 2-/3-byte code assignment table 316, the code converting unit 350 encodes the low-frequency word into the 2-byte code "A000h". In another example, when the obtained word is the low-frequency word set in "E90000h" in the 2-/3-byte code assignment table 316, the code converting unit 350 encodes the low-frequency word into the 3-byte code "E90000h".

Figure 14B:
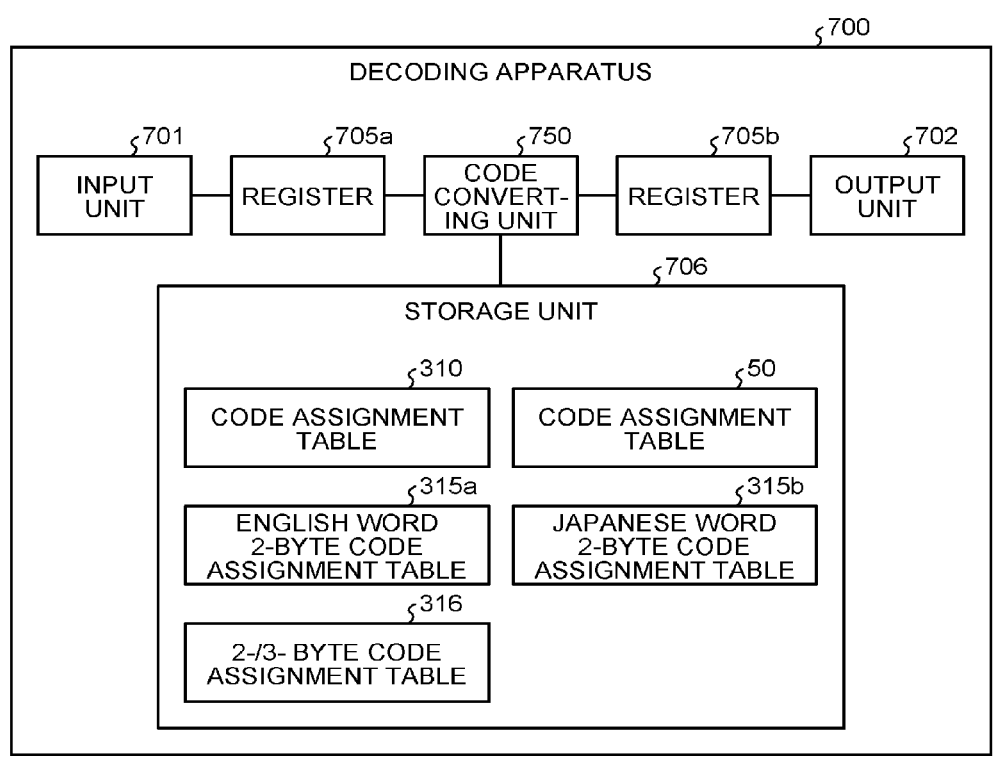
FIG. 14B is a functional block diagram illustrating a configuration of the decoding apparatus according to the third embodiment.

FIG. 14B is a functional block diagram illustrating a configuration of the decoding apparatus according to the third embodiment. As illustrated in FIG. 14B, a decoding apparatus 700 includes an input unit 701, an output unit 702, registers 705a and 705b, a storage unit 706, and a code converting unit 750.

The input unit 701 is a processing unit that receives text data on which the code conversion is to be performed. The input unit 701 stores the received text data into the register 705a.

The output unit 702 is a processing unit that outputs the text data after the character code conversion stored in the register 705b.

The register 705a is for storing therein the text data resulting from the code conversion. The register 705b is for storing therein the text data after the character code conversion.

The storage unit 706 includes the code assignment table 50, the code assignment table 310, the English word 2-byte code assignment table 315a, the Japanese word 2-byte code assignment table 315b, and the 2-/3-byte code assignment table 316. For example, the storage unit 706 corresponds to a storage device configured by using a semiconductor memory element such as a RAM, a ROM, a flash memory, or the like.

The explanation about the code assignment table 50 is the same as the explanation provided in the first embodiment. The explanation about the code assignment table 310 is the same as the explanation about the code assignment table 310 provided with reference to FIG. 15. The explanation about the English word 2-byte code assignment table 315a is the same as the explanation about the English word 2-byte code assignment table 315a provided with reference to FIG. 16. The explanation about the Japanese word 2-byte code assignment table 315b is the same as the explanation about the Japanese word 2-byte code assignment table 315b provided with reference to FIG. 17. The explanation about the 2-/3-byte code assignment table 316 is the same as the explanation about the 2-/3-byte code assignment table 316 provided with reference to FIG. 18.

The code converting unit 750 is a processing unit that switches between the code assignment tables on the basis of the code corresponding to a control character and performs a character code conversion on text data on the basis of the code assignment table being switched to. The code converting unit 750 performs a character code conversion on the text data including and following the control character "SI" by using the code assignment table 310. In contrast, when having detected a code corresponding to the control character "SO" from text data, the decoding apparatus 700 performs a character code conversion by using the code assignment table 50. The code converting unit 750 stores the text data resulting from the encoding process into the register 705b.

In the following sections, an example of a character code conversion performed by the code converting unit 750 by using the code assignment table 310 will be explained. The code converting unit 750 obtains a code from text data. The code converting unit 750 identifies one of the regions from among the regions 310A to 310F in which the information corresponding to the code obtained from the text data is set and further performs a character code conversion corresponding to the identified region.

An example in which the code obtained by the code converting unit 750 is a code corresponding to one of the control characters set in the control character 1-byte region 310A will be explained. The first byte of the code corresponding to one of the control characters set in the control character 1-byte region 310A is included in the range "00h to 1Fh". The code converting unit 750 selects the control character corresponding to the code from among the control characters set in the control character 1-byte region 310A and performs a character code conversion with the selected control character. For example, when the obtained code is "00h", the code converting unit 750 performs a character code conversion on "00h" and obtains "NUL".

When the obtained code is "0Eh", the code converting unit 750 performs a character code conversion on the code "0EH" to obtain "SO" and also switches the code assignment table to be used, into the code assignment table 50.

When the obtained code is "0Fh", the code converting unit 750 performs a character code conversion on the code "0Fh" to obtain "SI" and also switches the code assignment table to be used, into the code assignment table 310.

An example in which the code obtained by the code converting unit 750 is a code corresponding to one of the English words set in the English word 1-byte region 310B will be explained. The first byte of the code corresponding to one of the English words set in the English word 1-byte region 310B is included in the range "20h to 3Fh". The code converting unit 750 compares the obtained code with the codes corresponding to the English words set in the English word 1-byte region 310B, identifies the English word in the corresponding setting position, and performs a character code conversion on the obtained code. For example, when the obtained code is "27h", the code converting unit 750 performs a character code conversion on the code "27h" and obtains "the".

An example in which the code obtained by the code converting unit 750 is a code corresponding to one of the English words set in the English word 2-byte region 310C will be explained. The first byte of the code corresponding to one of the English words set in the English word 2-byte region 310C is included in the range "40h to 5Fh". The code converting unit 750 compares the obtained code with the English word 2-byte code assignment table 315a, identifies the English word in the corresponding setting position, and performs a character code conversion on the obtained code. For example, when the obtained code is "4000h", the code converting unit 750 performs a character code conversion to obtain the high-frequency English word corresponding to "4000h" in the English word 2-byte code assignment table 315a.

An example in which the code obtained by the code converting unit 750 is one of the low-frequency words set in the 2-/3-byte region 310F will be explained. The first byte of a code corresponding to one of the low-frequency words set in the 2-/3-byte region 310F is included in the range "A0h to FFh". The code converting unit 750 compares the obtained code with the 2-/3-byte code assignment table 316, identifies the low-frequency word in the corresponding setting position, and performs a character code conversion on the obtained code. For example, when the obtained code is "A000h", the code converting unit 750 performs a character code conversion to obtain the low-frequency word corresponding to "A000h" in the 2-/3-byte code assignment table 316.

FIG. 19A is a flowchart illustrating a processing procedure performed by the encoding apparatus according to the third embodiment. As illustrated in FIG. 19A, the input unit 301 included in the encoding apparatus 300 stores text data into the register 305a (step S301). The code converting unit 350 included in the encoding apparatus 300 obtains information from the text data (step S302). Although the term "information" is used for the sake of convenience in the explanation, the information obtained by the code converting unit 350 at step S302 include information such as an English words, a Japanese word, a control character, or the like.

The code converting unit 350 judges whether the obtained information is one of the control characters "SO" and "SI" or not (step S303). When the information is one of the control characters "SO" and "SI" (step S303: Yes), the code converting unit 350 proceeds to step S304.

When the control character is "SO", the code converting unit 350 selects the code assignment table 50, and when the control character is "SI", the code converting unit 350 selects the code assignment table 310 (step S304) and proceeds to step S302.

In contrast, when the obtained information is neither the control character "SI" nor the control character "SI" (step S303: No), the code converting unit 350 performs a first code converting process (step S305). The code converting unit 350 judges whether the encoding process on the text data has been finished or not (step S306).

When the encoding process on the text data has not been finished (step S306: No), the code converting unit 350 proceeds to step S302. On the contrary, when the encoding process on the text data has been finished (step S306: Yes), the code converting unit 350 stores the text data resulting from the encoding process, into the register 305b (step S307).

Figure 20A:
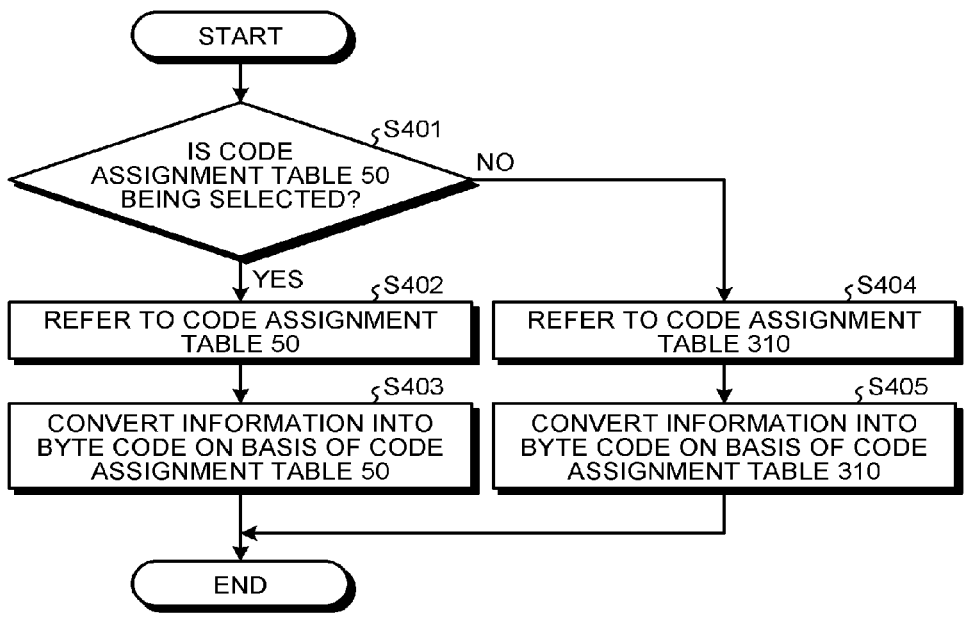
FIG. 20A is a flowchart illustrating a processing procedure in a first code converting process.

FIG. 20A is a flowchart illustrating a processing procedure in the first code converting process. The code converting process corresponds to the process at step S305 in FIG. 19A. As illustrated in FIG. 20A, the code converting unit 350 included in the encoding apparatus 300 judges whether the code assignment table 50 is currently being selected or not (step S401).

When the code assignment table 50 is currently being selected (step S401: Yes), the code converting unit 350 refers to the code assignment table 50 (step S402), and converts the information into a bytecode on the basis of the code assignment table 50 (step S403).

In contrast, when the code assignment table 50 is not currently being selected, but the code assignment table 310 is currently being selected (step S401: No), the code converting unit 350 proceeds to step S404. The code converting unit 350 refers to the code assignment table 310 (step S404) and converts the information into a bytecode on the basis of the code assignment table 310 (step S405).

FIG. 19B is a flowchart illustrating a processing procedure performed by the decoding apparatus according to the third embodiment. As illustrated in FIG. 19B, the input unit 701 included in the decoding apparatus 700 stores text data into the register 705a (step S701). The code converting unit 750 included in the decoding apparatus 700 obtains a code from the text data (step S702).

The code converting unit 750 judges whether the obtained code is a code corresponding to one of the control characters "SO" and "SI" or not (step S703). When the code is a code corresponding to one of the control characters "SO" and "SI" (step S703: Yes), the code converting unit 750 proceeds to step S704.

When the code is a code corresponding to "SO", the code converting unit 750 selects the code assignment table 50, and when the code is a code corresponding to "SI", the code converting unit 750 selects the code assignment table 310 (step S704) and proceeds to step S702.

In contrast, when the obtained code is neither a code corresponding to "SO" nor a code corresponding to "SI" (step S703: No), the code converting unit 750 performs a second code converting process (step S705). The code converting unit 750 judges whether the decoding process on the text data has been finished (step S706).

When the decoding process on the text data has not been finished (step S706: No), the code converting unit 750 proceeds to step S702. On the contrary, when the decoding process on the text data has been finished (step S706: Yes), the code converting unit 750 stores the text data resulting from the decoding process, into the register 705b (step S707).

Figure 20B:
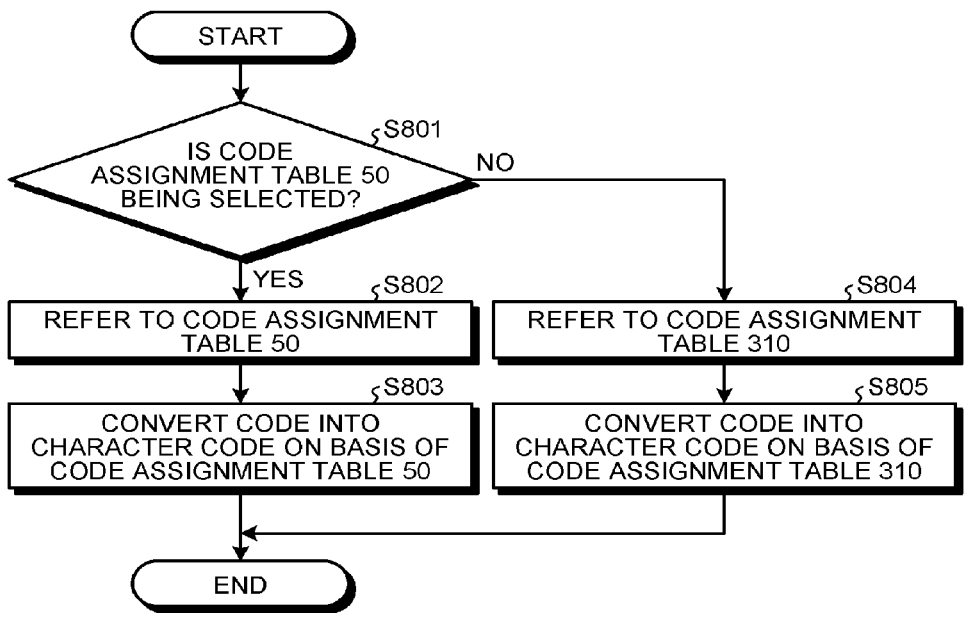
FIG. 20B is a flowchart illustrating a processing procedure in a second code converting process.

FIG. 20B is a flowchart illustrating a processing procedure in the second code converting process. The code converting process corresponds to the process at step S705 in FIG. 19B. As illustrated in FIG. 20B, the code converting unit 750 included in the decoding apparatus 700 judges whether the code assignment table 50 is currently being selected or not (step S801).

When the code assignment table 50 is currently being selected (step S801: Yes), the code converting unit 750 refers to the code assignment table 50 (step S802) and converts the bytecode into a character code on the basis of the code assignment table 50 (step S803).

In contrast, when the code assignment table 50 is not currently being selected, but the code assignment table 310 is currently being selected (step S801: No), the code converting unit 750 proceeds to step S804. The code converting unit 750 refers to the code assignment table 310 (step S804) and converts the bytecode into a character code on the basis of the code assignment table 310 (step S805).

Next, an advantageous effect of the encoding apparatus 300 according to the third embodiment will be explained. The encoding apparatus 300 uses the code assignment tables by switching between the conventional code assignment table 50 and the code assignment table 310 specific to the third embodiment. For example, when having detected the control character "SI" from the text data, the encoding apparatus 300 performs the code conversion on the text data including and following the control character "SI" by using the code assignment table 310. In contrast, when having detected the control character "SO" from the text data, the encoding apparatus 300 performs the code conversion by using the code assignment table 50. With these arrangements, it is possible to assign the short bytecodes to each of the characters and the words of which the frequency of appearance is high, while keeping compatibility with the code conversion that uses the conventional code assignment table 50.

Further, the decoding apparatus 700 decodes the encoded text data by using the code assignment tables while switching between the code assignment tables 50 and 310 described above. Consequently, even when the short bytecodes are assigned to the words of which the frequency of appearance is high and the general symbols, it is possible to convert the bytecodes into the words and the general symbols, while keeping the compatibility with the character code conversion that uses the conventional code assignment table 50.

[d] Fourth Embodiment

Figure 21:
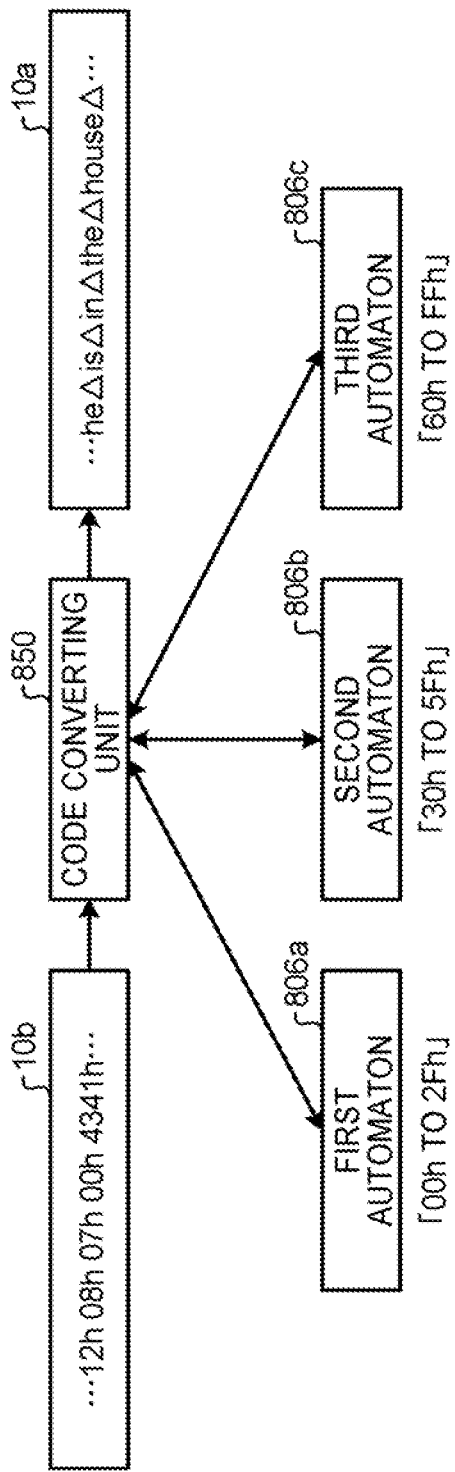
FIG. 21 is a drawing of an example of a process performed by a decoding apparatus according to a fourth embodiment.

FIG. 21 is a drawing of an example of a process performed by a decoding apparatus according to a fourth embodiment. The decoding apparatus according to the fourth embodiment generates the text data 10a, by performing a character code conversion on the code-converted text data 10b, while employing a first automaton 806a, a second automaton 806b, and a third automaton 806c. The text data 10b has been code-converted by, for example, the encoding apparatus 100 described in the first embodiment.

The first automaton 806a brings 1-byte codes into correspondence with text corresponding to the 1-byte codes. FIG. 22 is a table illustrating an example of the first automaton. As illustrated in FIG. 22, the first automaton 806a brings each of the codes "00h to 2Fh" into correspondence with a different one of the words. For example, the words kept in correspondence with the codes "00h to 2Fh" correspond to the words in the 1-byte region 110A described with reference to FIG. 3.

The second automaton 806b brings 2-byte codes into correspondence with predetermined character strings, the space, symbols, high-frequency words, and the like. FIG. 23 is a table illustrating an example of the second automaton. As illustrated in FIG. 23, the second automaton 806b brings the codes "3000h to 5FFFh" into correspondence with character strings, the space, symbols, high-frequency words, and the like. Although omitted from the drawing, the second automaton 806b may also bring 2-byte codes into correspondence with alphanumeric characters, symbols, the Japanese Hiragana alphabet, the Japanese Katakana alphabet, Japanese Kanji characters, numerical values, times, tags, and syntax. For example, the pieces of information kept in correspondence with the codes "3000h to 5FFFh" correspond to the pieces of information kept in correspondence with the codes "3000h to 5FFFh" in the 2-byte code assignment table 115a described with reference to FIG. 4.

The third automaton 806c brings 3-byte codes into correspondence with predetermined CJK characters, English words, Japanese words, words from third countries, numerical values, times, tags, and results of syntactic and semantic analyses. FIG. 24 is a table illustrating an example of the third automaton. As illustrated in FIG. 24, the third automaton 806c brings the codes "600000h to FFFFFFh" into correspondence with predetermined CJK characters, English words, Japanese words, words from third countries, numerical values, times, tags, and results of syntactic and semantic analyses. In this situation, "E00000h to FFFFFFh" correspond to a spare region. For example, the pieces of information kept in correspondence with "600000h to FFFFFFh" correspond to the pieces of information kept in correspondence with the codes "600000h to FFFFFFh" in the 3-byte code assignment table 115b described with reference to FIG. 5.

Returning to the description of FIG. 21, a code converting unit 850 reads a code from the code-converted text data 10b and selects one from among the first automaton 806a, the second automaton 806b, and the third automaton 806c on the basis of the values in the first four bits of the code. Further, the code converting unit 850 converts the code on the basis of the selected automaton.

For example, when the first four bits of the code are included in the range of "00h to 2Fh", the code converting unit 850 selects the first automaton 806a and converts the code on the basis of the first automaton 806a.

In another example, when the first four bits of the code are included in the range of "30h to 5Fh", the code converting unit 850 selects the second automaton 806b and converts the code on the basis of the second automaton 806b.

In yet another example, when the first four bits of the code are included in the range of "60h to FFh", the code converting unit 850 selects the third automaton 806c and converts the code on the basis of the third automaton 806c.

Because the first four bits of each of the codes "12h, 08h, 07h, and 00h" contained in the text data 10b illustrated in FIG. 21 are included in the range "00h to 2Fh", the code converting unit 850 selects the first automaton 806a and converts the codes. For example, on the basis of the first automaton 806a, the code converting unit 850 converts "12h, 08h, 07h, and 00h" into "heΔ, isΔ, inΔ, and theΔ", respectively.

Because the first four bits of the code "4341h" contained in the text data 10b illustrated in FIG. 21 are included in the range "30h to 5Fh", the code converting unit 850 selects the second automaton 806b and converts the code. For example, on the basis of the second automaton 806b, the code converting unit 850 converts "4341h" into "houseΔ". As a result of the processes performed by the code converting unit 850 described above, the text data 10b has been converted into the text data 10a.

Figure 25:
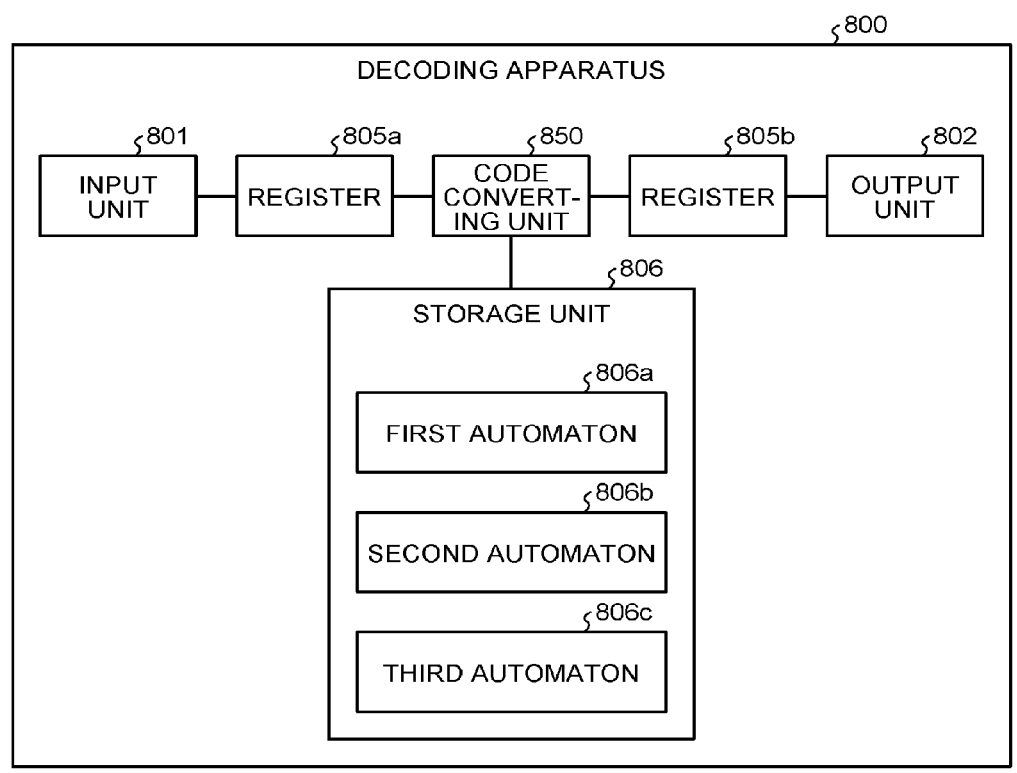
FIG. 25 is a functional block diagram illustrating a configuration of a decoding apparatus according to the fourth embodiment.

FIG. 25 is a functional block diagram illustrating a configuration of a decoding apparatus according to the fourth embodiment. As illustrated in FIG. 25, a decoding apparatus 800 includes an input unit 801, an output unit 802, registers 805a and 805b, a storage unit 806, and the code converting unit 850.

The input unit 801 is a processing unit that receives text data resulting from the code conversion. The input unit 801 stores the received text data into the register 805a.

The output unit 802 is a processing unit that outputs text data stored in the register 805b.

The storage unit 806 includes the first automaton 806a, the second automaton 806b, and the third automaton 806c. For example, the storage unit 806 corresponds to a storage device configured by using a semiconductor memory element such as a RAM, a ROM, a flash memory, or the like.

Explanations of the first automaton 806a, the second automaton 806b, and the third automaton 806c are the same as the explanations of the first automaton 806a, the second automaton 806b, and the third automaton 806c provided with reference to FIG. 21.

The code converting unit 850 reads a code from the code-converted text data 10b and selects one from among the first automaton 806a, the second automaton 806b, and the third automaton 806c on the basis of the values in the first four bits of the code. Further, the code converting unit 850 converts the code on the basis of the selected automaton. Specific processes performed by the code converting unit 850 are the same as the processes performed by the code converting unit 850 explained with reference to FIG. 21.

Figure 26:
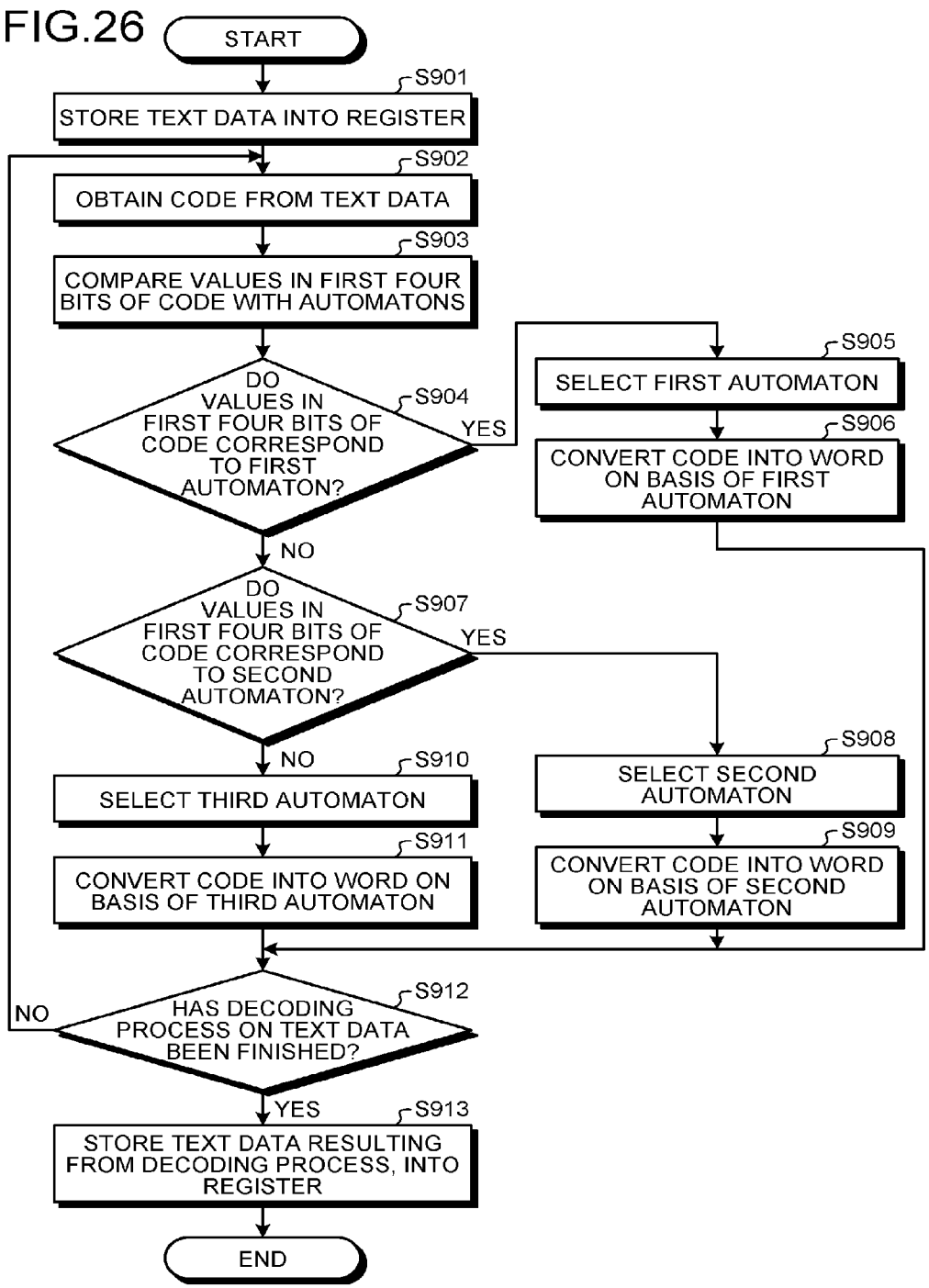
FIG. 26 is a flowchart illustrating a processing procedure performed by the decoding apparatus according to the fourth embodiment.

FIG. 26 is a flowchart illustrating a processing procedure performed by the decoding apparatus according to the fourth embodiment. As illustrated in FIG. 26, the input unit 801 included in the decoding apparatus 800 stores text data into the register 805a (step S901). The code converting unit 850 included in the decoding apparatus 800 obtains a code from the text data stored in the register 805a (step S902).

The code converting unit 850 compares the values in the first four bits of the code with the automatons (step S903). The code converting unit 850 judges whether the values in the first four bits of the code correspond to the first automaton 806a (step S904). When the values in the first four bits of the code correspond to the first automaton 806a (step S904: Yes), the code converting unit 850 selects the first automaton 806a (step S905). The code converting unit 850 converts the code into a word on the basis of the first automaton 806a (step S906) and proceeds to step S912.

On the contrary, when the values in the first four bits of the code do not correspond to the first automaton 806a (step S904: No), the code converting unit 850 judges whether the values in the first four bits of the code correspond to the second automaton 806b (step S907). When the values in the first four bits of the code correspond to the second automaton 806b (step S907: Yes), the code converting unit 850 selects the second automaton 806b (step S908). The code converting unit 850 converts the code into a word on the basis of the second automaton 806b (step S909) and proceeds to step S912.

On the contrary, when the values in the first four bits of the code do not correspond to the second automaton 806b (step S907: No), the code converting unit 850 selects the third automaton 806c (step S910). The code converting unit 850 converts the code into a word on the basis of the third automaton 806c (step S911).

The code converting unit 850 judges whether the decoding process on the text data has been finished or not (step S912). When the decoding process on the text data has not been finished (step S912: No), the code converting unit 850 proceeds to step S902.

On the contrary, when the decoding process on the text data has been finished (step S912: Yes), the code converting unit 850 stores the text data resulting from the decoding process into the register 805b (step S913).

Next, advantageous effects of the decoding apparatus 800 will be explained. The decoding apparatus 800 reads a code from the code-converted text data 10b and selects one from among the first automaton 806a, the second automaton 806b, and the third automaton 806c, on the basis of the values in the first four bits of the code. After that, the decoding apparatus 800 converts the code on the basis of the selected automaton. As a result, it is possible to perform the decoding process appropriately by employing the decoding apparatus 800, even in situations where the encoding apparatus 100 or the like assign codes having two or more bytes such as codes that are kept in correspondence with high-frequency characters and words to 1-byte codes. In other words, by employing the decoding apparatus 800, it is possible to assign codes having two or more bytes such as codes that are kept in correspondence with high-frequency characters and words to 1-byte codes.

Figure 27:
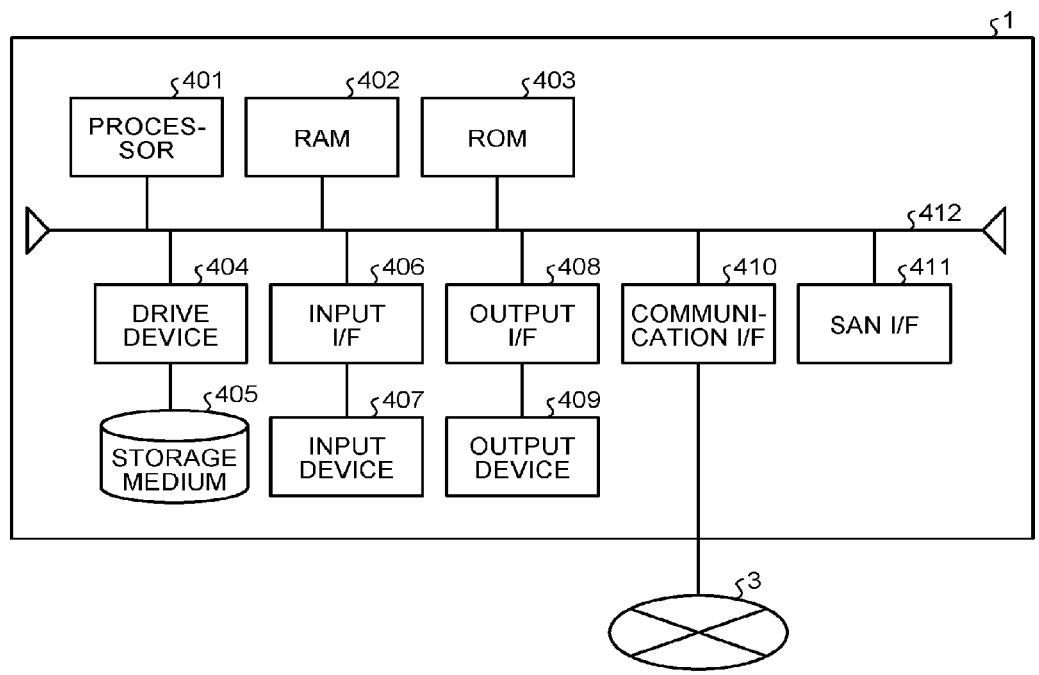
FIG. 27 is a diagram illustrating an example of a hardware configuration of a computer.

Next, hardware and software that can be used in any of the embodiments described herein will be explained. FIG. 27 is a diagram illustrating an example of a hardware configuration of a computer 1. For example, the computer 1 includes a processor 401, a Random Access Memory (RAM) 402, a Read-Only Memory (ROM) 403, a drive device 404, a storage medium 405, an input interface (I/F) 406, an input device 407, an output interface (I/F) 408, an output device 409, a communication interface (I/F) 410, a Storage Area Network (SAN) interface (I/F) 411, and a bus 412. The pieces of hardware are connected together via the bus 412.

The RAM 402 is a memory device from and to which it is possible to read and write data and is configured by using, for example, a semiconductor memory such as a Static RAM (SRAM) or a Dynamic RAM (DRAM), or a flash memory when not being a RAM. The ROM 403 may be a Programmable ROM (PROM) or the like. The drive device 404 is a device that performs at least one selected from reading and writing of the information recorded in the storage medium 405. The storage medium 405 stores therein any information written thereto by the drive device 404. The storage medium 405 is a storage medium configured with, for example, a hard disk, a flash memory such as a Solid State Drive (SSD), a Compact Disc (CD), a Digital Versatile Disc (DVD), a Blu ray disc, or the like. Further, for example, the computer 1 is provided with a drive device 404 and a storage medium 405 for each of a plurality of types of storage media.

The input interface 406 is a circuit that is connected to the input device 407 and is configured to transfer an input signal received from the input device 407 to the processor 401. The output interface 408 is a circuit that is connected to the output device 409 and is configured to cause the output device 409 to yield an output in response to an instruction from the processor 401. The communication interface 410 is a circuit that controls communication performed via a network 3. The communication interface 410 may be a network interface card (NIC), for example. The SAN interface 411 is a circuit that controls communication with any storage device connected to the computer 1 via a storage area network. The SAN interface 411 may be a Host Bus Adapter (HBA), for example.

The input device 407 is a device that transmits the input signal in response to an operation. The input signal may be, for example, a key device such as a keyboard or a button installed in the main body of the computer 1 or a pointing device such as a mouse or a touch panel. The output device 409 is a device that outputs information in response to the control exercised by the computer 1. The output device 409 may be, for example, an image output device (a display device) such as a display monitor or an audio output device such as a speaker. Further, for example, an input/output device such as a touch screen may be used as the input device 407 and the output device 409. Furthermore, the input device 407 and the output device 409 may integrally be formed with the computer 1 or may be connected to the computer 1 from the outside thereof without being included in the computer 1, for example.

For example, the processor 401 reads a computer program (hereinafter, "program") stored in the ROM 403 or the storage medium 405 into the RAM 402, and implements the processes performed by the input unit 101, 201, or 301, the code converting unit 150, 250, or 350, and the output unit 102, 202, or 302, according to the procedure of the read program. In that situation, the RAM 402 is used as a work area of the processor 401. The functions of the storage unit are realized as a result of the ROM 403 and the storage medium 405 storing therein program files (e.g., an application program 24, middleware 23, and an Operating System (OS) 22) and a data file (e.g., text data or a character string subject to a comparison process), while the RAM 402 is being used as a work area of the processor 401. The programs read by the processor 401 will be explained with reference to FIG. 28.

Figure 28:
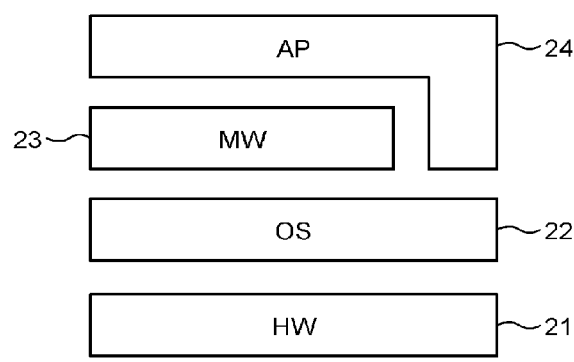
FIG. 28 is a diagram illustrating an exemplary configuration of a computer program working in a computer.

FIG. 28 illustrates an exemplary configuration of the programs working in the computer. In the computer 1, the Operating System (OS) 22 that controls a group of hardware 21 (401 to 412) illustrated in FIG. 28 operates. As a result of the processor 401 operating according to the procedure set forth by the OS 22, so as to control and manage the group of hardware 21, processes according to the application program 24 and the middleware 23 are performed by the group of hardware 21. Further, in the computer 1, either the middleware 23 or the application program 24 is read into the RAM 402 and is executed by the processor 401.

The functions of the code converting unit 150, 250, or 350 are realized as a result of the processor 401 performing processes based on at least a part of the middleware 23 or the application program 24 (by controlling the group of hardware 21 to perform the processes on the basis of the OS 22), when comparison functions are invoked. Each of the comparison functions may be included in the application program 24 itself or may be a part of the middleware 23 that is executed when being invoked according to the application program 24.

Figures 29, 30:
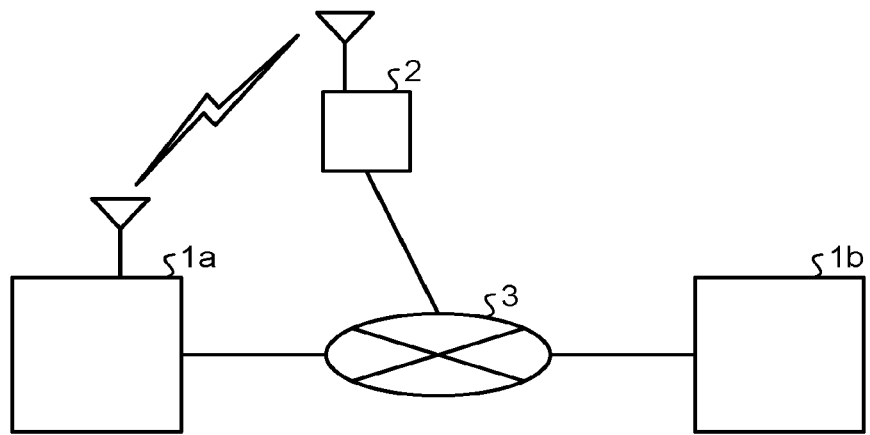
FIG. 29 is a diagram illustrating an exemplary configuration of apparatuses included in a system according to an embodiment.
FIG. 30 is a drawing for explaining a conventional code assignment table based on the ASCII code and Unicode.

FIG. 29 illustrates an exemplary configuration of apparatuses included in a system according to any of the embodiments described herein. The system illustrated in FIG. 29 includes a computer 1a, a computer 1b, a base station 2, and the network 3. The computer 1a is connected to the network 3 connected to the computer 1b, in a wireless and/or wired manner. The functions of the encoding apparatus 100, 200, or 300 illustrated in FIG. 2A, 8A, or 14A may be included in either the computer 1a or the computer 1b illustrated in FIG. 29. Further, the functions of the decoding apparatus 500, 600, 700, or 800 illustrated in FIG. 2B, 8B, 14B, or 25 may be included in either the computer 1a or the computer 1b illustrated in FIG. 29.

It is possible to assign the short bytecode to each of the characters and words of which the frequency of appearance is high.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A non-transitory computer-readable recording medium having stored therein an encoding program that causes a computer to execute a process comprising:
encoding input text data based on a code assignment table stored in a storage device that defines a conversion rule for encoding text data, wherein;
the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

2. The non-transitory computer-readable recording medium according to claim 1, wherein the code assignment table is one selected from between: a code assignment table in which alphanumeric characters in the 1-byte region of the first code assignment table are set in a 1-byte region thereof; and a code assignment table in which the alphanumeric characters in the 1-byte region of the first code assignment table are set in the 2-byte region thereof.

3. The non-transitory computer-readable recording medium according to claim 1, wherein
the storage device further stores therein the first code assignment table, and
the encoding selects one of the first and the code assignment tables on a basis of a control character included in the input text data and encodes the input text data on a basis of the selected one of the first code assignment tables and the code assignment table.

4. An encoding method comprising:
encoding input text data based on a code assignment table stored in a storage device that defines a conversion rule for encoding text data, wherein;
the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

5. The encoding method according to claim 4, wherein the code assignment table is one selected from between: a code assignment table in which alphanumeric characters in the 1-byte region of the first code assignment table are set in a 1-byte region thereof; and a code assignment table in which the alphanumeric characters in the 1-byte region of the first code assignment table are set in the 2-byte region thereof.

6. The encoding method according to claim 4, wherein
the storage device further stores therein the first code assignment table, and
the encoding selects one of the first and the code assignment tables on a basis of a control character included in the input text data and encodes the input text data on a basis of the selected one of the first code assignment tables and the code assignment table.

7. An encoding apparatus comprising:
a memory; and
a processor that executes a process comprising:
encoding input text data based on a code assignment table stored in the memory that defines a conversion rule for encoding text data, wherein;
the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

8. The encoding apparatus according to claim 7, wherein the code assignment table is one selected from between: a code assignment table in which alphanumeric characters in the 1-byte region of the first code assignment table are set in a 1-byte region thereof; and a code assignment table in which the alphanumeric characters in the 1-byte region of the first code assignment table are set in the 2-byte region thereof.

9. The encoding apparatus according to claim 7, wherein
the memory further stores therein the first code assignment table, and
the encoding selects one of the first and the code assignment tables on a basis of a control character included in the input text data and encodes the input text data on a basis of the selected one of the first code assignment tables and the code assignment table.

10. A non-transitory computer-readable recording medium having stored therein a decoding program that causes a computer to execute a process comprising:
decoding encoded data into text data based on a code assignment table stored in a storage device that defines a conversion rule for encoding text data, wherein;

the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

11. A decoding method comprising:

decoding encoded data into text data based on a code assignment table stored in a storage device that defines a conversion rule for encoding text data, wherein;

the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

12. A decoding apparatus comprising:

a memory; and a processor that executes a process comprising:

decoding encoded data into text data based on a code assignment table stored in the memory that defines a conversion rule for encoding text data, wherein;

the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

13. A non-transitory computer-readable recording medium having stored therein a decoding program that causes a computer to execute a process comprising:

generating a plurality of automatons from a code assignment table stored in a storage device, the code assignment table defining a conversion rule for encoding text data, the conversion rule being defined so that values in first four bits of codes resulting from the encoding differ depending on code lengths of the codes;

decoding encoded data into text data by using one of a plurality of automatons that is selected in accordance with values in first four bits of the data; wherein the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

14. A decoding method comprising:

generating a plurality of automatons from a code assignment table stored in a storage device, the code assignment table defining a conversion rule for encoding text data, the conversion rule being defined so that values in first four bits of codes resulting from the encoding differ depending on code lengths of the codes;

decoding encoded data into text data by using one of a plurality of automatons that is selected in accordance with values in first four bits of the data; wherein the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

15. A decoding apparatus comprising:

a memory; and a processor that executes a process comprising:

generating a plurality of automatons from a code assignment table stored in the memory, the code assignment table defining a conversion rule for encoding text data, the conversion rule being defined so that values in first four bits of codes resulting from the encoding differ depending on code lengths of the codes;

decoding encoded data into text data by using one of a plurality of automatons that is selected in accordance with values in first four bits of the data; wherein the code assignment table being generated by assigning a part of character strings assigned to a 1-byte region of a first code assignment table to a 2-byte region of the code assignment table, and by assigning one or more codes each having two or more bytes to at least a part of character strings assigned to the 2-byte region of the code assignment table.

* * * * *